(12) United States Patent
Inada et al.

(10) Patent No.: US 10,690,827 B2
(45) Date of Patent: Jun. 23, 2020

(54) TRANSMISSION DECORATIVE FILM AND METHOD OF MANUFACTURING TRANSMISSION DECORATIVE FILM

(71) Applicant: FUJIFILM Corporation, Tokyo (JP)

(72) Inventors: Hiroshi Inada, Kanagawa (JP);
Mitsuyoshi Ichihashi, Kanagawa (JP);
Shigeaki Nimura, Kanagawa (JP); Rie Takasago, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/390,025

(22) Filed: Apr. 22, 2019

(65) Prior Publication Data
US 2019/0243045 A1    Aug. 8, 2019

Related U.S. Application Data

(63) Continuation of application No. PCT/JP2017/038514, filed on Oct. 25, 2017.

(30) Foreign Application Priority Data

Oct. 25, 2016  (JP) ................................. 2016-208603
Jan. 6, 2017   (JP) ................................. 2017-000977
Feb. 14, 2017  (JP) ................................. 2017-025283

(51) Int. Cl.
*G02B 5/30*       (2006.01)
*G03F 7/00*       (2006.01)
(Continued)

(52) U.S. Cl.
CPC ............. *G02B 5/3016* (2013.01); *G02B 5/30* (2013.01); *G03F 7/0007* (2013.01);
(Continued)

(58) Field of Classification Search
CPC .................................................... G02B 5/3016
See application file for complete search history.

(56) References Cited

U.S. PATENT DOCUMENTS

2003/0160924 A1    8/2003  Kashima
2004/0046926 A1    3/2004  Ishizaki
(Continued)

FOREIGN PATENT DOCUMENTS

JP    2003140134    5/2003
JP    2003149426    5/2003
(Continued)

OTHER PUBLICATIONS

"International Search Report (Form PCT/ISA/210) of PCT/JP2017/038514," dated Jan. 30, 2018, with English translation thereof, pp. 1-5.
(Continued)

*Primary Examiner* — Edmond C Lau
(74) *Attorney, Agent, or Firm* — JCIPRNET

(57) ABSTRACT

A transmission decorative film includes a circular polarization plate and a circular polarization reflection layer disposed on the circular polarization plate. The circular polarization reflection layer includes at least one or more first cholesteric liquid crystalline layers that reflect any one of left circularly polarized light or right circularly polarized light. The first cholesteric liquid crystalline layer includes two or more reflection regions having different selective reflection wavelengths. The circular polarization plate transmits circularly polarized light having a revolution direction opposite to a revolution direction of the circularly polarized light reflected by the first cholesteric liquid crystalline layer.

12 Claims, 9 Drawing Sheets

(51) Int. Cl.
G02F 1/1335 (2006.01)
G02F 1/13357 (2006.01)
(52) U.S. Cl.
CPC .... G02F 1/13362 (2013.01); G02F 1/133536 (2013.01); G02F 2001/133541 (2013.01); G02F 2001/133543 (2013.01); G02F 2201/343 (2013.01)

(56) References Cited

U.S. PATENT DOCUMENTS

| | | | |
|---|---|---|---|
| 2007/0229928 A1 | 10/2007 | Hoffmuller et al. | |
| 2012/0120350 A1 | 5/2012 | Ma | |
| 2012/0262767 A1* | 10/2012 | Ida | G02B 5/3016 359/2 |
| 2014/0160540 A1 | 6/2014 | Hoshino et al. | |

FOREIGN PATENT DOCUMENTS

| | | |
|---|---|---|
| JP | 2003149439 | 5/2003 |
| JP | 2009300662 | 12/2009 |
| JP | 2011100098 | 5/2011 |
| WO | 2011092922 | 8/2011 |
| WO | 2012137550 | 10/2012 |

OTHER PUBLICATIONS

"Written Opinion of the International Searching Authority (Form PCT/ISA/237) of PCT/JP2017/038514," dated Jan. 30, 2018, with English translation thereof, pp. 1-7.

* cited by examiner

TRANSMISSION DECORATIVE FILM AND METHOD OF MANUFACTURING TRANSMISSION DECORATIVE FILM

CROSS-REFERENCE TO RELATED APPLICATIONS

This application is a Continuation of PCT International Application No. PCT/JP2017/038514 filed on Oct. 25, 2017, which claims priority under 35 U.S.C. § 119(a) to Japanese Patent Application No. 2016-208603 filed on Oct. 25, 2016, Japanese Patent Application No. 2017-000977 filed on Jan. 6, 2017 and Japanese Patent Application No. 2017-025283 filed on Feb. 14, 2017. Each of the above applications is hereby expressly incorporated by reference, in its entirety, into the present application.

BACKGROUND OF THE INVENTION

1. Field of the Invention

The present invention relates to a transmission decorative film and a method of manufacturing a transmission decorative film.

2. Description of the Related Art

A layer including a cholesteric liquid crystalline phase (hereinafter, also referred to as a "cholesteric liquid crystalline layer") is known as a layer having properties of selectively reflecting any one of right circularly polarized light or left circularly polarized light in a specific wavelength range. Accordingly, the cholesteric liquid crystalline layer is applied for various uses, and for example, applied for a display device for displaying images having partially different color tones (JP2009-300662A).

SUMMARY OF THE INVENTION

Meanwhile, recently, there are various demands for decorative films capable of displaying specific images and the like, and for example, a transmission type decorative film (transmission decorative film) that is capable of visually recognizing a scene of the other side through the film, capable of visually recognizing a specific display from one side (front surface), and substantially not capable of visually recognizing the display from the other side (rear surface). Particularly, from the rear surface, in a case where not only the specific display substantially displayed on the front surface cannot be visually recognized, but also a display of a color tone or a display of an image which is completely different from the specific display can be displayed, the decorative effect further increases.

A liquid crystal display device disclosed in examples of JP2009-300662A mainly aims at displaying an image formed on a liquid crystal layer (image that can be obtained by including two or more regions having selective reflection wavelengths different from each other, in the cholesteric liquid crystalline layer) with a higher tone, and there is no research for an aspect in which the displayed image differs depending on an observation surface. The examples of JP2009-300662A aims at effectively showing a tone of a liquid crystal layer, and a thick light absorption layer is formed on a side opposite to the liquid crystal layer using a black ink. Accordingly, in a case of performing the observation using the surface on a side opposite to the liquid crystal layer as the observation surface, the scenery outside cannot be seen through the layer.

Therefore, an object of the present invention is to provide a transmission decorative film capable of applying different visual effects on observation surfaces, and a method of manufacturing the same.

As a result of intensive studies for achieving the object described above, the inventors have found that the problem described above can be solved with a transmission decorative film including a circular polarization plate, and a circular polarization reflection layer disposed on the circular polarization plate, and the present invention has been completed.

That is, the inventors have found that the object described above can be achieved with the following configurations.

(1) A transmission decorative film comprising: a circular polarization plate; and a circular polarization reflection layer disposed on the circular polarization plate, in which the circular polarization reflection layer includes at least one or more first cholesteric liquid crystalline layers that reflect any one of left circularly polarized light or right circularly polarized light, the first cholesteric liquid crystalline layer includes two or more reflection regions having different selective reflection wavelengths, and the circular polarization plate transmits circularly polarized light having a revolution direction opposite to a revolution direction of the circularly polarized light reflected by the first cholesteric liquid crystalline layer.

(2) The transmission decorative film according to (1), in which the selective reflection wavelengths in the two or more reflection regions are different from each other by 30 nm or more.

(3) The transmission decorative film according to (1) or (2), in which a haze of the circular polarization reflection layer is 30% or less.

(4) The transmission decorative film according to any one of (1) to (3), in which the circular polarization reflection layer includes a plurality of the first cholesteric liquid crystalline layers.

(5) The transmission decorative film according to any one of (1) to (4), in which the circular polarization reflection layer further includes a second cholesteric liquid crystalline layer that reflects circularly polarized light having a revolution direction opposite to that of the circularly polarized light reflected by the first cholesteric liquid crystalline layer, and includes two or more reflection regions having selective reflection wavelengths different from each other.

(6) A method of manufacturing the transmission decorative film according to any one of (1) to (5), the method comprising: a step of forming a coating using a liquid crystal composition including a liquid crystal compound including a polymerizable group, and a chiral agent sensitive to light and capable of changing a helical pitch of a cholesteric liquid crystalline phase; a step of performing an exposure treatment on the coating in a pattern shape, with light to which the chiral agent is sensitive; a step of performing a heating treatment on the coating subjected to the exposure treatment and aligning the liquid crystal compound to be in a state of a cholesteric liquid crystalline phase; and a step of performing a curing treatment on the coating subjected to the heating treatment and forming the first cholesteric liquid crystalline layer formed by fixing the cholesteric liquid crystalline phase.

According to the present invention, it is possible to provide a transmission decorative film capable of applying different visual effects on observation surfaces and a method of manufacturing the same.

DESCRIPTION OF THE PREFERRED EMBODIMENTS

Figure 1:
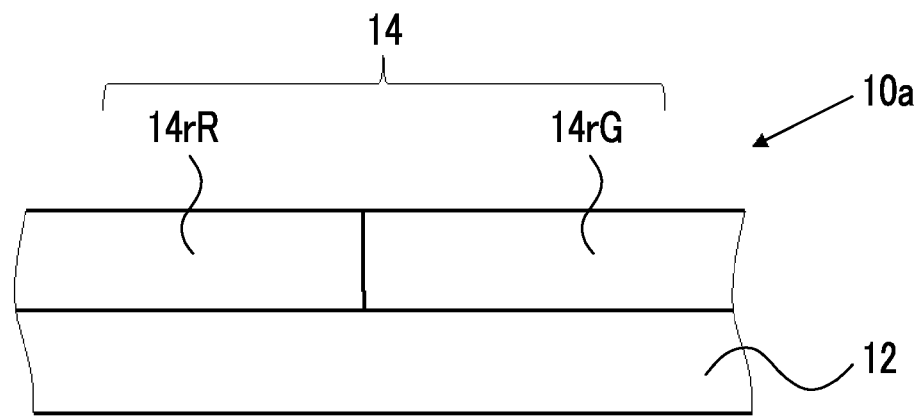
FIG. 1 is a cross section schematic view showing an example of an embodiment of a transmission decorative film of the present invention.

Hereinafter, the present invention will be described in detail.

The description of configuration elements described below is performed based on the representative embodiments of the present invention, but the present invention is not limited to such embodiments.

In the present specification, a range of numerical values shown using "to" means a range including numerical values before and after "to" as a lower limit value and an upper limit value.

In addition, a specific angle such as 45° includes a range of errors allowed in the technical field of the present invention. For example, in the present invention, the angle means an angle less than ±5° of the specifically shown exact angle, and the error of the specifically shown exact angle is preferably equal to or smaller than ±3° and more preferably equal to or smaller than ±1°.

In this specification, a term "sense" used in a case of describing circularly polarized light means that the circularly polarized light is right circularly polarized light or left circularly polarized light. In a case where the light is seen so that the light travels towards the front side and a distal end of an electric field vector rotates clockwise according to passage of time, the sense of the circularly polarized light is defined as right circularly polarized light, and in a case where the distal end thereof rotates counterclockwise, the sense of the circularly polarized light is defined as left circularly polarized light.

In this specification, the term "sense" may be used for a twisted direction of a helix of a cholesteric liquid crystalline phase. Regarding selective reflection of the cholesteric liquid crystalline phase, in a case where the twisted direction of the helix of the cholesteric liquid crystalline phase (sense) is right, the right circularly polarized light is reflected and the left circularly polarized light is transmitted, and in a case where the sense is left, the left circularly polarized light is reflected and right circularly polarized light is transmitted.

In this specification, a term "(meth)acrylate" is a term representing both acrylate and methacrylate.

Visible light is light having wavelengths which are visually recognizable by a person among electromagnetic waves and indicates light in a wavelength range of 380 nm to 780 nm. Invisible light is light in a wavelength range less than 380 nm or a wavelength range exceeding 780 nm.

Although it is not limited to this, in the visible light, light in a wavelength range of 420 to 490 nm is blue light, light in a wavelength range of 495 to 570 nm is green light, and light in a wavelength range of 620 to 750 nm is red light.

Infrared light is electromagnetic waves in a wavelength range exceeding 780 nm and equal to or less than 1 mm. Ultraviolet light is light in a wavelength range equal to or more than 10 nm and less than 380 nm.

In this specification, the selective reflection wavelength is an average value of two wavelengths showing half value transmittance: T1/2(%) shown with the following equation, in a case where a minimum value of transmittance of a target product (member) is set as Tmin (%).

Equation for acquiring half value transmittance:
$T1/2 = 100 - (100 - Tmin)/2$

[Transmission Decorative Film]

A transmission decorative film comprising: a circular polarization plate; and a circular polarization reflection layer disposed on the circular polarization plate, in which the circular polarization reflection layer includes at least one or more first cholesteric liquid crystalline layers that reflect any one of left circularly polarized light or right circularly polarized light, the first cholesteric liquid crystalline layer includes two or more reflection regions having different selective reflection wavelengths, and the circular polarization plate transmits circularly polarized light having a revolution direction opposite to a revolution direction of the circularly polarized light reflected by the first cholesteric liquid crystalline layer.

Hereinafter, the embodiment of the present invention will be described in detail with reference to the drawings.

First Embodiment

FIG. 1 is a cross section schematic view showing an example of the embodiment (First Embodiment) of a transmission decorative film of the present invention. The drawing of the present invention is a schematic view and a relationship between thicknesses, a positional relationship, and the like of layers do not necessarily correspond to actual figures. The same applies to the drawings hereinafter.

A transmission decorative film 10a shown in FIG. 1 includes a circular polarization plate 12, and a first cholesteric liquid crystalline layer 14 which is disposed on the circular polarization plate 12 and reflects right circularly polarized light. The circular polarization plate 12 is a left circular polarization plate which transmits left circularly polarized light.

In FIG. 1, the first cholesteric liquid crystalline layer 14 corresponds to the circular polarization reflection layer of the present invention.

The first cholesteric liquid crystalline layer 14 is a layer including a cholesteric liquid crystalline phase, and includes two regions having different helical pitch of the cholesteric liquid crystalline phase from each other. More specifically, the first cholesteric liquid crystalline layer 14 includes a red right circular polarization reflection region 14rR which reflects right circularly polarized red light and transmits left circularly polarized red light and light in other wavelength ranges, and a green right circular polarization reflection region 14rG which reflects right circularly polarized green light and transmits left circularly polarized green light and light in other wavelength ranges. That is, in the first cholesteric liquid crystalline layer 14, the red right circular polarization reflection region 14rR and the green right circular polarization reflection region 14rG are formed in a desired pattern.

Each of the red right circular polarization reflection region 14rR and the green right circular polarization reflection region 14rG is a layer including the cholesteric liquid crystalline phase, and has wavelength selective reflectivity with respect to right circularly polarized light in a specific wavelength range.

In general, a selective reflection wavelength $\lambda$ depends on a pitch P (=period of helix) of a helical structure of the cholesteric liquid crystalline phase and is in a relationship of an average refractive index of the cholesteric liquid crystalline phase and $\lambda = n \times P$. Accordingly, the selective reflection wavelength can be adjusted by adjusting the pitch of the helical structure. The pitch of the cholesteric liquid crystalline phase depends on the kind of a chiral agent used with a polymerizable liquid crystal compound or an added concentration thereof, and thus, a desired pitch can be obtained by adjusting these.

A half-width $\Delta\lambda$ ($nm$) of the selective reflection range (circular polarization reflection region) showing the selective reflection depends on a refractive index anisotropy $\Delta n$ of the cholesteric liquid crystalline phase and a pitch P of the helix, and is in a relationship of $\Delta\lambda = \Delta n \times P$. Accordingly, a width of the selective reflection range can be controlled by adjusting $\Delta n$. $\Delta n$ can be adjusted in accordance with the kind of the liquid crystal compound forming the reflection region, a mixing ratio thereof, and a temperature during the alignment. It is known that a reflectivity of the cholesteric liquid crystalline phase depends on $\Delta n$, and in a case of obtaining the same degree of the reflectivity, as $\Delta n$ increases, the number of helical pitches decreases, that is, a film thickness can be decreased.

As a measuring method of the sense or pitch of the helix, methods disclosed in "Introduction: Liquid Crystal Experiments" (edited by the Japanese Liquid Crystal Society, Sigma Publications, published in 2007 p. 46) and "Liquid Crystal Handbook" (Liquid Crystal Handbook Editorial Committee, Maruzen Publishing, p. 196) can be used.

The reflected light of the cholesteric liquid crystalline phase is circularly polarized light. The fact whether or not the reflected light is right circularly polarized light or left circularly polarized light depends on a twisted direction of the helix of the cholesteric liquid crystalline phase. Regarding the selective reflection of the circularly polarized light due to the cholesteric liquid crystalline phase, in a case where the twisted direction of the helix of the cholesteric liquid crystalline phase is right, the right circularly polarized light is reflected, and in a case where the twisted direction of the helix of the cholesteric liquid crystalline phase is left, the left circularly polarized light is reflected.

Accordingly, in the transmission decorative film 10a, the red right circular polarization reflection region 14rR and the green right circular polarization reflection region 14rG are a layer including a right-twisted cholesteric liquid crystalline phase.

A direction of revolution of the cholesteric liquid crystalline phase can be adjusted in accordance with the kinds of a liquid crystal compound forming the reflection region or the kinds of a chiral agent to be added.

The first cholesteric liquid crystalline layer 14 may have light diffusibility. The light diffusibility means a property that light incident to the cholesteric liquid crystalline layer is reflected to a wide range. It is preferable that the cholesteric liquid crystalline layer has light diffusibility, because a visual recognition range is further widened.

As an aspect of the cholesteric liquid crystalline layer having light diffusibility, a cholesteric liquid crystalline layer including a light diffusing element is used. Examples of the light diffusing element include organic particles, inorganic particles, and bubbles.

As another aspect of the cholesteric liquid crystalline layer having light diffusibility, a cholesteric liquid crystalline layer including an alignment defect of a liquid crystal compound is used.

As still another aspect of the cholesteric liquid crystalline layer having light diffusibility, a cholesteric liquid crystalline layer having a structure in which an angle formed by a helix axis of the cholesteric liquid crystalline phase and a surface of the cholesteric liquid crystalline layer periodically changes (undulation structure) is used. That is, the cholesteric liquid crystalline layer is a layer which includes a cholesteric liquid crystalline phase, and in which, in a case where a streak pattern of bright portions and dark portions derived from the cholesteric liquid crystalline phase is applied to a cross section view of the cholesteric liquid crystalline layer observed with a scanning electron microscope, an angle formed by a normal line of a line formed by at least one dark portion, and a surface of the circular polarization reflection layer periodically changes.

The light diffusibility is excellent, as long as the layer is the cholesteric liquid crystalline layer having an alignment defect or the cholesteric liquid crystalline layer having an undulation structure (undulate structure) described above.

A haze of the circular polarization reflection layer is not particularly limited, and is preferably equal to or smaller than 30% and more preferably equal to or smaller than 15%, from a viewpoint of more excellent light diffusibility.

In the present specification, the "haze" means a value measured with a haze meter NDH-2000 manufactured by Nippon Denshoku Industries Co., Ltd.

A thickness of the first cholesteric liquid crystalline layer 14 is not particularly limited, and is preferably 1 to 10 μm, more preferably 2 to 8 μm, and even more preferably 3 to 6 μm, from a viewpoint of both excellent color developability and alignment.

More specific configuration and manufacturing method of the cholesteric liquid crystalline layer will be described later.

The circular polarization plate 12 transmits circularly polarized light (left circularly polarized light) having a revolution direction opposite to the revolution direction of the circularly polarized light reflected by the first cholesteric liquid crystalline layer 14.

As the circular polarization plate 12, a circular polarization plate in which a linear polarization plate and a λ/4 plate are laminated is used. As the configuration of the circular polarization plate, the λ/4 plate and the linear polarization plate are disposed in this order from the side of the first cholesteric liquid crystalline layer 14. The linear polarization plate and the λ/4 plate are disposed in accordance with a slow axis of the λ/4 plate and a transmission axis of the linear polarization plate, so that the left circularly polarized light of the light incident from the side of the λ/4 plate is transmitted as the linearly polarized light. More specifically, normally, the linear polarization plate and the λ/4 plate are disposed so that an angle formed by the slow axis of the λ/4 plate and the transmission axis of the linear polarization plate becomes 45°.

Although not shown, a pressure sensitive adhesive layer may be disposed between the first cholesteric liquid crystalline layer 14 and the circular polarization plate 12.

Regarding the transmission decorative film 10a, the visual effects are different in a case where the observation is performed from the side of the first cholesteric liquid crystalline layer 14 and the circular polarization plate 12.

Next, the operation of the transmission decorative film 10a configured as described above will be described with reference to FIG. 2. Hereinafter, the operation is described by setting a surface of the first cholesteric liquid crystalline layer 14 on a side opposite to the side of the circular polarization plate 12 as a "front surface" and by setting a surface thereof on the side of the circular polarization plate 12 as a "rear surface". Also, regarding the transmission decorative film of Second Embodiment and Third Embodiment which will be described later, the operation will be described by setting the surface thereof on the side of the circular polarization reflection layer as a "front surface" and by setting the surface thereof on the side of the circular polarization plate as a "rear surface".

Figure 2:
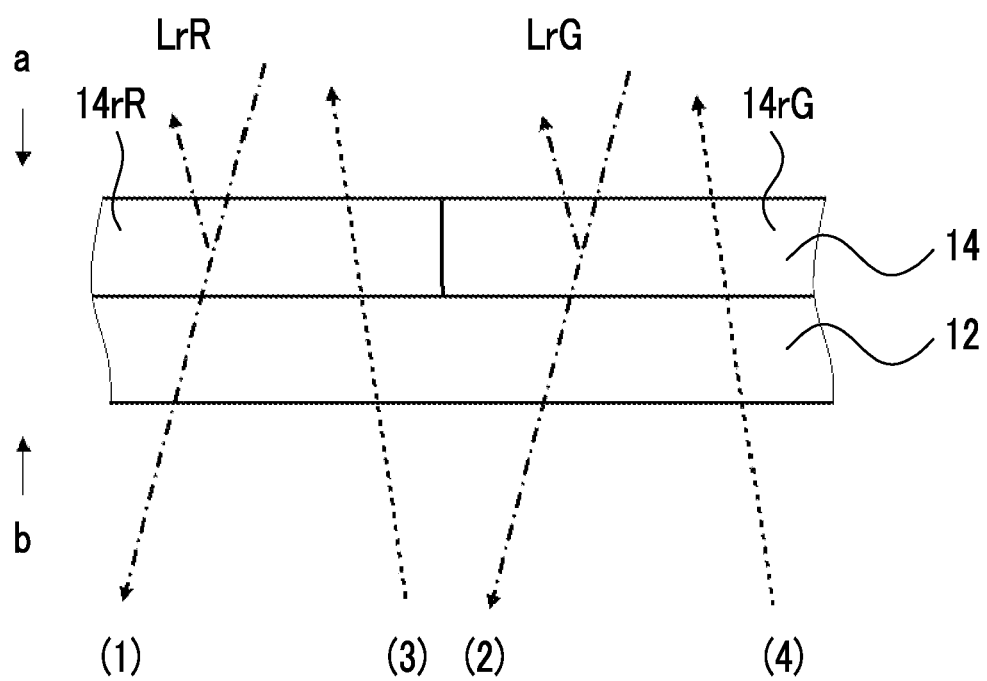
FIG. 2 is a schematic view for describing an operation of the transmission decorative film shown in FIG. 1.

As shown in FIG. 2, among the light incident to the transmission decorative film 10a from the front surface side, right circularly polarized red light LrR is reflected in the red right circular polarization reflection region 14rR, and the light which is not reflected in the red right circular polarization reflection region 14rR is transmitted through the red right circular polarization reflection region 14rR and is incident to the circular polarization plate 12. The left circularly polarized light of the light incident to the circular polarization plate 12 is transmitted through the circular polarization plate 12 (see: broken line (1) of FIG. 2).

The right circularly polarized green light LrG is reflected in the green right circular polarization reflection region 14rG, and the light which is not reflected in the green right circular polarization reflection region 14rG is transmitted through the green right circular polarization reflection region 14rG and is incident to the circular polarization plate 12. The left circularly polarized light of the light incident to the circular polarization plate 12 is transmitted through the circular polarization plate 12 (see: broken line (2) of FIG. 2).

Meanwhile, only the left circularly polarized light of the light incident to the transmission decorative film 10a from the rear surface side is transmitted through the circular polarization plate 12. The left circularly polarized light transmitted through the circular polarization plate 12 travels in a revolution direction which is opposite to the revolution direction of the helix of the cholesteric liquid crystalline phase of the first cholesteric liquid crystalline layer 14, and accordingly, the left circularly polarized light is not reflected by the first cholesteric liquid crystalline layer 14 and is transmitted through the first cholesteric liquid crystalline layer 14 (see: dotted line (3) and dotted line (4) of FIG. 2).

Therefore, in a case where the transmission decorative film 10a is observed from the front surface side (in FIG. 2, in a view in the a direction), the scene of the other side of the transmission decorative film 10a is visually recognized by the left circularly polarized light transmitted and incident from the rear surface side, and the light at the selective reflection wavelength of the reflection region of the first cholesteric liquid crystalline layer 14 is visually recognized.

Figure 3:
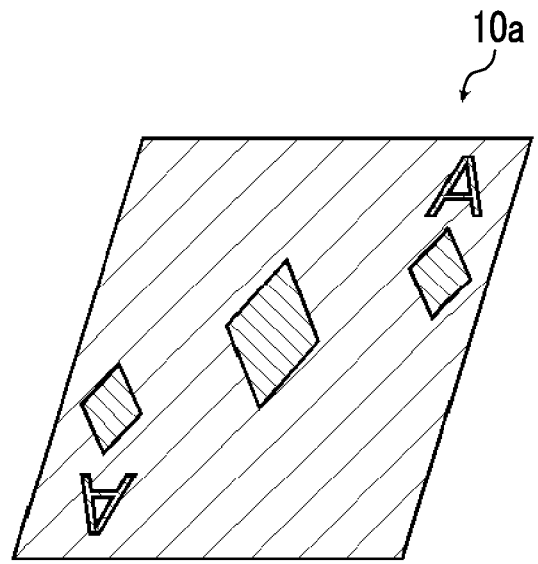
FIG. 3 is a view showing FIG. 2 in an a direction.

That is, in a view in the a direction in FIG. 2, an image having a pattern according to the formation pattern of the reflection region of the first cholesteric liquid crystalline layer 14 is visually recognized (FIG. 3).

Figure 4:
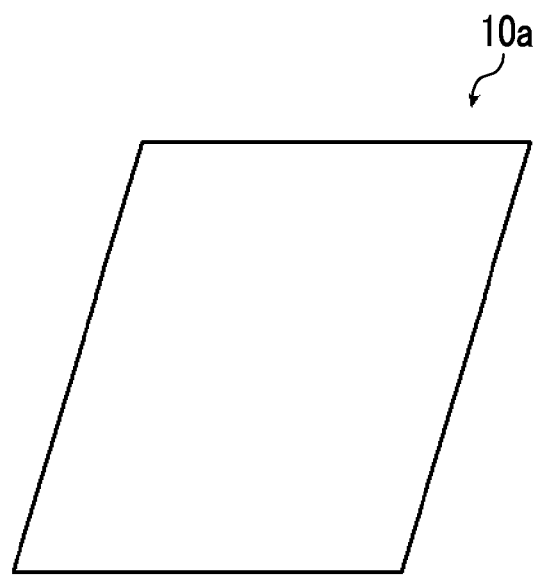
FIG. 4 is a view showing FIG. 2 in a b direction.

In the same manner, in a case where the transmission decorative film 10a is observed from the rear surface side (in FIG. 2, in a view in the b direction), the scene of the other side of the transmission decorative film 10a is visually recognized by the left circularly polarized light transmitted and incident from the front surface side, and the image displayed on the first cholesteric liquid crystalline layer 14 capable of being observed from the front surface side is not visually recognized (FIG. 4).

Therefore, the transmission decorative film 10a has transparency and an image seen from the one surface side (a direction) and the image seen from the other surface side (b direction) are different from each other.

In the above description, a combination of the first cholesteric liquid crystalline layer (circular polarization reflection layer) which reflects right circularly polarized light and the left circular polarization plate has been described, but the present invention is not limited to this combination, as long as it is a combination of the first cholesteric liquid crystalline layer (circular polarization reflection layer) which reflects left circularly polarized light and the right circular polarization plate (circular polarization plate which transmits right circularly polarized light).

In addition, in the above description, the first cholesteric liquid crystalline layer including the red right circular polarization reflection region 14rR and green right circular polarization reflection region 14rG has been described, but the present invention is not limited to this combination, as long as it is a first cholesteric liquid crystalline layer including two or more reflection regions having different selective reflection wavelengths.

A difference between selective reflection wavelengths of two or more reflection regions is not particularly limited, and the selective reflection wavelengths of two or more reflection regions are preferably different from each other by 30 nm or more and more preferably different from each other by 45 nm or more.

In FIG. 1, the first cholesteric liquid crystalline layer has a configuration including two kinds of the reflection regions having different selective reflection wavelengths, but the configuration is not limited thereto, as long as it is a configuration including three or more kinds of reflection regions.

The reflection region may be formed of 1 layer and may have a multiplayer configuration.

The widening of the wavelength range of reflected light can be realized by laminating layers having the shifted selective reflection wavelength λ in order. In addition, a technology of widening the wavelength range by a method of changing the helical pitch in the layer stepwise which is called a pitch gradient method has been known, and examples thereof include methods disclosed in Nature 378, 467-469 (1995), JP1994-281814A (JP-H06-281814A), and JP4990426B.

The selective reflection wavelength in the reflection region can be set in any range of visible light (approximately 380 to 780 nm) and near infrared light (approximately higher than 780 nm and equal to or lower than 2,000 nm) and the setting method thereof is as described above.

Second Embodiment

Figure 5:
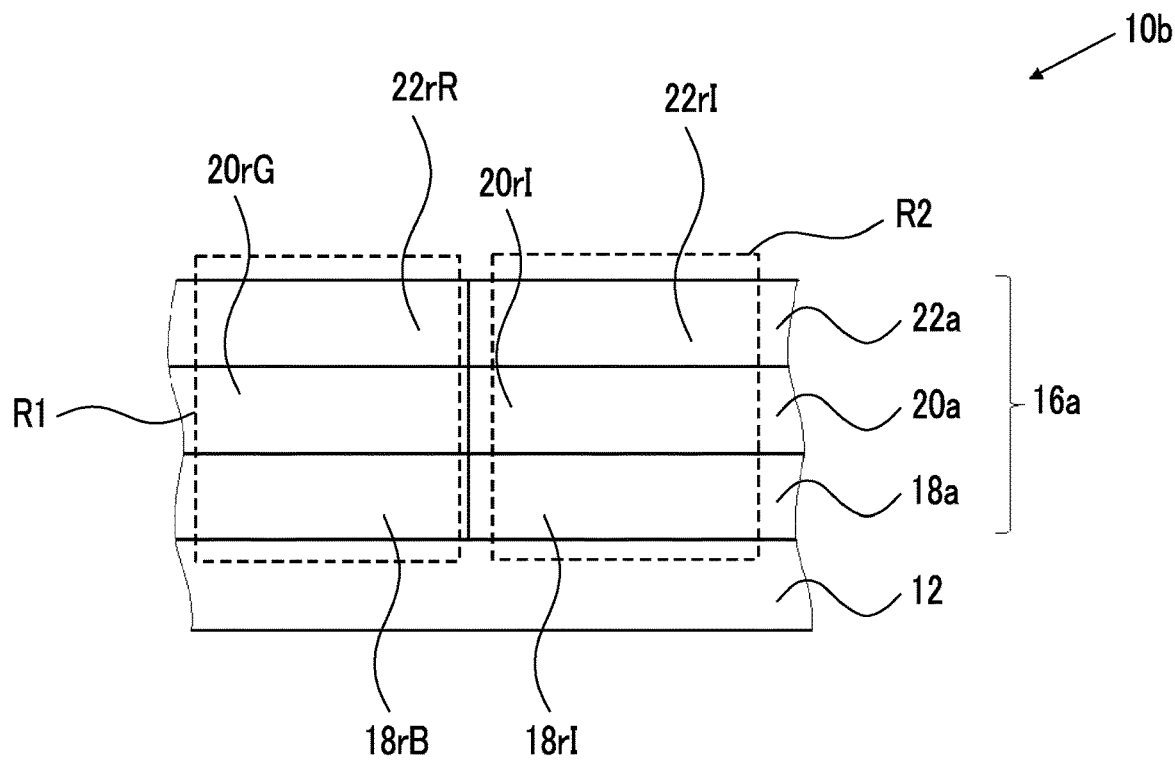
FIG. 5 is a cross section schematic view showing another example of the embodiment of the transmission decorative film of the present invention.

FIG. 5 shows a cross section schematic view showing another example of the embodiment (Second Embodiment) of the transmission decorative film of the present invention.

A transmission decorative film 10b shown in FIG. 5 includes the circular polarization plate 12, and a circular polarization reflection layer 16a disposed on the circular polarization plate 12. The circular polarization reflection layer 16a is configured by laminating three layers of a first cholesteric liquid crystalline layer 18a, a first cholesteric liquid crystalline layer 20a, and a first cholesteric liquid crystalline layer 22a which reflect right circularly polarized light.

Each of the three first cholesteric liquid crystalline layers configuring the circular polarization reflection layer 16a includes two reflection regions having different selective reflection wavelengths in the same plane.

More specifically, the first cholesteric liquid crystalline layer 18a includes a blue right circular polarization reflection region 18rB which reflects right circularly polarized blue light and transmits left circularly polarized blue light and light in other wavelength ranges, and an infrared right circular polarization reflection region 18rI which reflects right circularly polarized infrared light and transmits left circularly polarized infrared light and light in other wavelength ranges.

The first cholesteric liquid crystalline layer 20a includes a green right circular polarization reflection region 20rG which reflects right circularly polarized green light and transmits left circularly polarized green light and light in other wavelength ranges, and an infrared right circular polarization reflection region 20rI which reflects right circularly polarized infrared light and transmits left circularly polarized infrared light and light in other wavelength ranges.

The first cholesteric liquid crystalline layer 22a includes a red right circular polarization reflection region 22rR which reflects right circularly polarized red light and transmits left circularly polarized red light and light in other wavelength ranges, and an infrared right circular polarization reflection region 22rI which reflects right circularly polarized infrared light and transmits left circularly polarized infrared light and light in other wavelength ranges.

Each of the three first cholesteric liquid crystalline layers includes regions having selective reflection wavelengths different from each other.

The blue right circular polarization reflection region 18rB, the green right circular polarization reflection region 20rG, and the red right circular polarization reflection region 22rR are disposed in an overlapped manner, in a case where the transmission decorative film 10b is observed from the front surface side. Accordingly, in a case where the transmission decorative film 10b is observed from the front surface side, a region R1 surrounded with a dotted line in FIG. 5 is visually recognized as a white image due to the mixed color of RGB.

In addition, the infrared right circular polarization reflection region 18rI, the infrared right circular polarization reflection region 20rI, the infrared right circular polarization reflection region 22rI are disposed in an overlapped manner, in a case where the transmission decorative film 10b is observed from the front surface side. Accordingly, in a case where the transmission decorative film 10b is observed from the front surface side, a region R2 surrounded with a dotted line in FIG. 5 is visually recognized as a transparent region.

As described above, by disposing a plurality of the first cholesteric liquid crystalline layers and adjusting the selective reflection wavelength of the reflection region included in each layer, a width of color tones which can be expressed is widened, and a variation of images displayed by the circular polarization reflection layer can be increased.

In addition, in a case where the transmission decorative film 10b is observed from the rear surface side, the image displayed on the circular polarization reflection layer 16a (the first cholesteric liquid crystalline layer 18a, the first cholesteric liquid crystalline layer 20a, and the first cholesteric liquid crystalline layer 22a) capable of being observed from the front surface side is not visually recognized, in the same manner as the transmission decorative film 10a.

In FIG. 5, the aspect in which the three first cholesteric liquid crystalline layers are included in the circular polarization reflection layer has been described, but the present invention is not limited to this aspect, as long as at least one layer of the first cholesteric liquid crystalline layer is included in the circular polarization reflection layer.

In addition, in FIG. 5, the aspect in which the three first cholesteric liquid crystalline layers respectively include the blue right circular polarization reflection region 18rB, the green right circular polarization reflection region 20rG, and the red right circular polarization reflection region 22rR has been described, but the present invention is not limited to this aspect, and it is preferable that the laminated first cholesteric liquid crystalline layers respectively include regions having selective reflection wavelengths different from each other.

Figure 6:
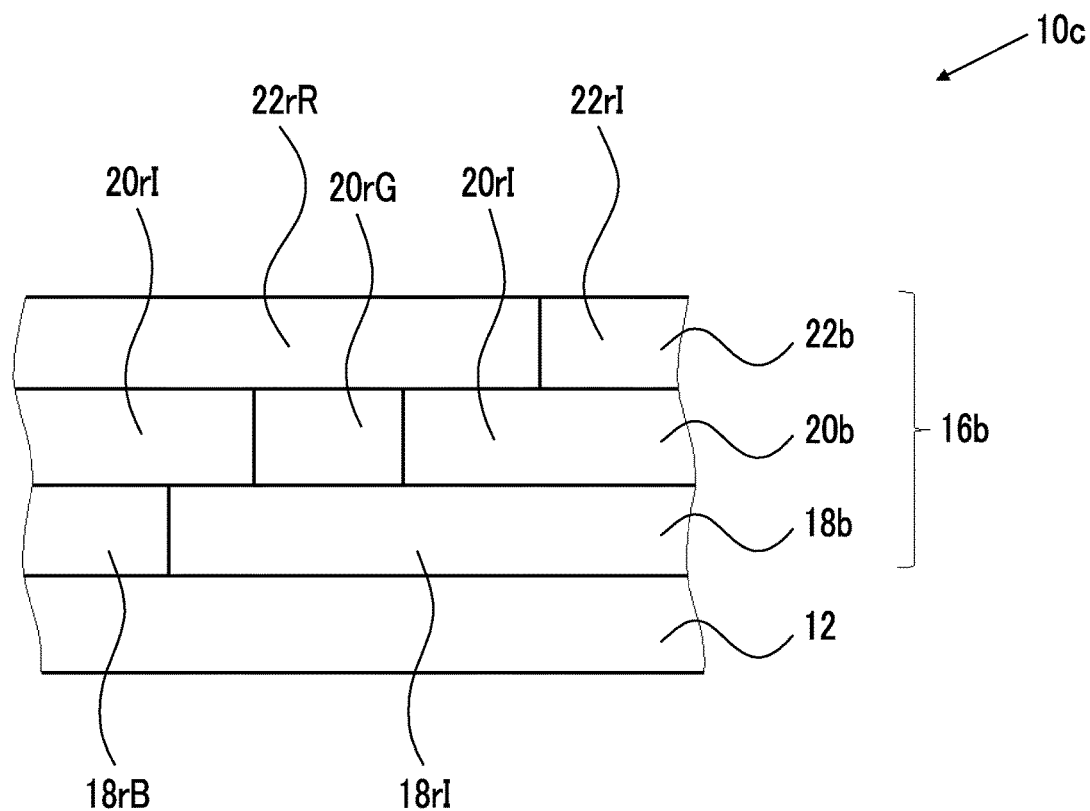
FIG. 6 is a cross section schematic view showing another example of the embodiment of the transmission decorative film of the present invention.

In addition, in FIG. 5, the aspect in which the reflection regions having different selective reflection wavelengths disposed in each first cholesteric liquid crystalline layer are overlapped in a laminated direction, but the aspect is not limited thereto, and an aspect of a transmission decorative film 10c shown in FIG. 6 may be used, for example.

A transmission decorative film 10c shown in FIG. 6 includes a circular polarization reflection layer 16b, and the circular polarization reflection layer 16b includes a first cholesteric liquid crystalline layer 18b including the blue right circular polarization reflection region 18rB and the infrared right circular polarization reflection region 18rI, a first cholesteric liquid crystalline layer 20b including the green right circular polarization reflection region 20rG and the infrared right circular polarization reflection region 20rI, and a first cholesteric liquid crystalline layer 22b including the red right circular polarization reflection region 22rR and the infrared right circular polarization reflection region 22rI.

In a case where the transmission decorative film 10c is observed from the front surface side, the positions of the blue right circular polarization reflection region 18rB, the green right circular polarization reflection region 20rG, and the red right circular polarization reflection region 22rR are not overlapped.

Third Embodiment

Figure 7:
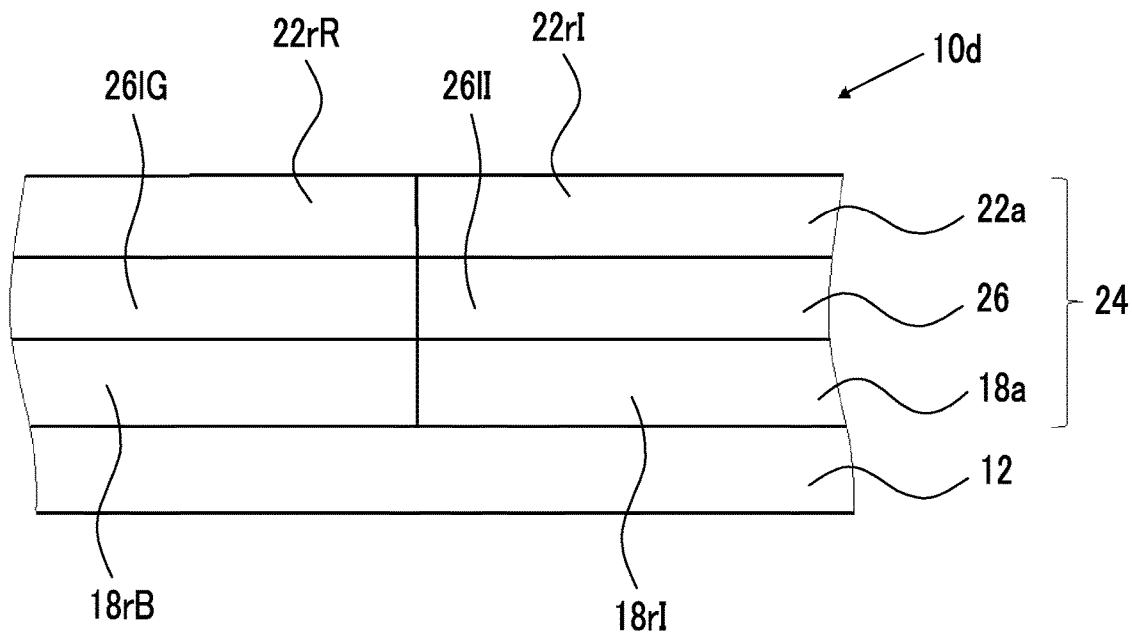
FIG. 7 is a cross section schematic view showing another example of the embodiment of the transmission decorative film of the present invention.

FIG. 7 shows a cross section schematic view showing another example of the embodiment (Third Embodiment) of the transmission decorative film of the present invention.

A transmission decorative film 10d shown in FIG. 7 includes the circular polarization plate 12, and a circular polarization reflection layer 24 disposed on the circular polarization plate 12. The circular polarization reflection layer 24 includes the first cholesteric liquid crystalline layer 18a which reflects right circularly polarized light, a second cholesteric liquid crystalline layer 26 which reflects left circularly polarized light, and the first cholesteric liquid crystalline layer 22a which reflects right circularly polarized light.

The first cholesteric liquid crystalline layer 18a includes the blue right circular polarization reflection region 18rB which reflects right circularly polarized blue light and transmits left circularly polarized blue light and light in other wavelength ranges, and the infrared right circular polarization reflection region 18rI which reflects right circularly polarized infrared light and transmits left circularly polarized infrared light and light in other wavelength ranges.

The second cholesteric liquid crystalline layer 26 includes a green left circular polarization reflection region 26lG which reflects left circularly polarized green light and transmits right circularly polarized green light and light in other wavelength ranges, and an infrared left circular polarization reflection region 26 lI which reflects left circularly polarized infrared light and transmits right circularly polarized infrared light and light in other wavelength ranges.

The first cholesteric liquid crystalline layer 22a includes the red right circular polarization reflection region 22rR which reflects right circularly polarized red light and transmits left circularly polarized red light and light in other wavelength ranges, and the infrared right circular polarization reflection region 22rI which reflects right circularly polarized infrared light and transmits left circularly polarized infrared light and light in other wavelength ranges.

In a case where the transmission decorative film 10d is observed from the front surface side, the blue right circular polarization reflection region 18rB, the green left circular polarization reflection region 26lG, and the red right circular polarization reflection region 22rR are disposed in an overlapped manner.

Next, the operation of the transmission decorative film 10d configured as described above will be described with reference to FIG. 8.

Figure 8:
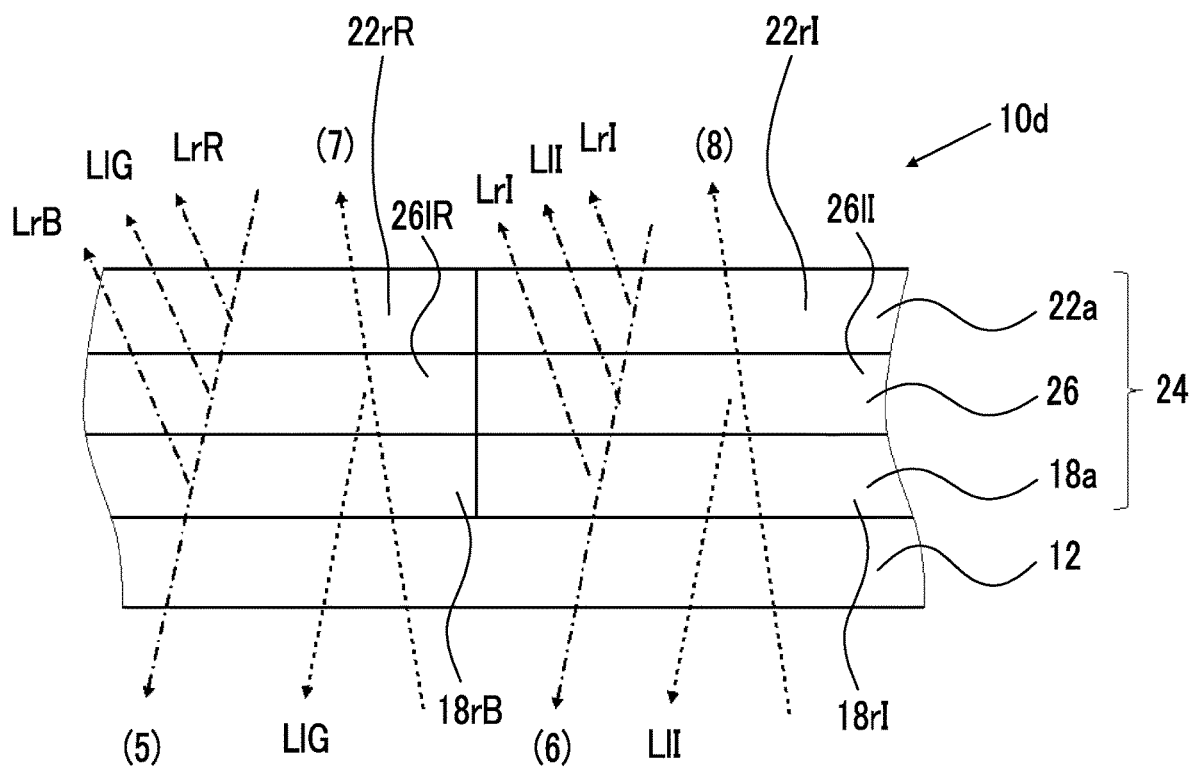
FIG. 8 is a schematic view for describing an operation of the transmission decorative film shown in FIG. 7.

As shown in FIG. 8, among the light incident to the transmission decorative film 10d from the front surface side, left circularly polarized red light LrR is reflected in the red right circular polarization reflection region 22rR, and the light which is not reflected in the red right circular polarization reflection region 22rR is transmitted through the red right circular polarization reflection region 22rR and is incident to the green left circular polarization reflection region 26lG.

Next, left circularly polarized green light LlG is reflected in the green left circular polarization reflection region 26lG, and the light which is not reflected in the green left circular polarization reflection region 26lG is transmitted through the green left circular polarization reflection region 26lG and is incident to the blue right circular polarization reflection region 18rB.

Next, right circularly polarized blue light LrB is reflected in the blue right circular polarization reflection region 18rB, and the light which is not reflected in the blue right circular polarization reflection region 18rB is transmitted through the blue right circular polarization reflection region 18rB and is incident to the circular polarization plate 12. The left circularly polarized light of the light incident to the circular polarization plate 12 is transmitted through the circular polarization plate 12 (see: broken line (5) of FIG. 8).

In addition, the right circularly polarized infrared light LrI is reflected in the infrared right circular polarization reflection region 22rI, and the light which is not reflected in the infrared right circular polarization reflection region 22rI is transmitted through the infrared right circular polarization reflection region 22rI and is incident to the infrared left circular polarization reflection region 26lI.

Next, the left circularly polarized infrared light LlI is reflected in the infrared left circular polarization reflection region 26lI, and the light which is not reflected in the infrared left circular polarization reflection region 26lI is transmitted through the infrared left circular polarization reflection region 26lI and is incident to the infrared right circular polarization reflection region 18rI.

Next, the right circularly polarized infrared light LrI is reflected in the infrared right circular polarization reflection region 18rI, and the light which is not reflected in the infrared right circular polarization reflection region 18rI is transmitted through the infrared right circular polarization reflection region 18rI and is incident to the circular polarization plate 12. The left circularly polarized light of the light incident to the circular polarization plate 12 is transmitted through the circular polarization plate 12 (see: broken line (6) of FIG. 8).

Meanwhile, only the left circularly polarized light of the light incident to the transmission decorative film 10d from the rear surface side is transmitted through the circular polarization plate 12. The left circularly polarized light transmitted through the circular polarization plate 12 travels in a revolution direction which is opposite to the revolution direction of the helix of the cholesteric liquid crystalline phase of the first cholesteric liquid crystalline layer 18a, and accordingly, the left circularly polarized light is not reflected by the first cholesteric liquid crystalline layer 18a, is transmitted through the first cholesteric liquid crystalline layer 18a, and is incident to the second cholesteric liquid crystalline layer 26.

Next, among the left circularly polarized light incident to the second cholesteric liquid crystalline layer 26, the left circularly polarized green light LlG is reflected in the green left circular polarization reflection region 26lG, and the light which is not reflected in the green left circular polarization reflection region 26lG is transmitted through the green left circular polarization reflection region 26lG and is incident to the first cholesteric liquid crystalline layer 22a.

Since the light incident to the first cholesteric liquid crystalline layer 22a is left circularly polarized light, the light is not reflected by the first cholesteric liquid crystalline layer 22a and is transmitted through the first cholesteric liquid crystalline layer 22a (see: broken line (7) of FIG. 8).

Among the left circularly polarized light incident to the second cholesteric liquid crystalline layer 26, the left circularly polarized infrared light LlI is reflected in the infrared left circular polarization reflection region 26lI, and the light which is not reflected in the infrared left circular polarization reflection region 26lI is transmitted through the infrared left circular polarization reflection region 26lI and is incident to the first cholesteric liquid crystalline layer 22a.

Since the light incident to the first cholesteric liquid crystalline layer 22a is the left circularly polarized light, the light is not reflected by the first cholesteric liquid crystalline layer 22a and is transmitted through the first cholesteric liquid crystalline layer 22a (see: broken line (8) of FIG. 8).

Accordingly, in a case where the transmission decorative film 10d is observed from the front surface side, the scene of the other side of the transmission decorative film 10d is visually recognized by the light transmitted and incident from the rear surface side (broken lines (7) and (8)), and the region where the blue right circular polarization reflection region 18rB of the first cholesteric liquid crystalline layer 18a, the green left circular polarization reflection region 26lG of the second cholesteric liquid crystalline layer 26, and the red right circular polarization reflection region 22rR of the first cholesteric liquid crystalline layer 22a are overlapped is visually recognized as a white image due to the mixed color of RGB. That is, in a case where the transmission decorative film 10d is observed from the front surface side, an image having a pattern according to the formation pattern of the reflection region of each of the first cholesteric liquid crystalline layer 18a, the second cholesteric liquid crystalline layer 26, and the first cholesteric liquid crystalline layer 22a is visually recognized.

Meanwhile, in a case where the transmission decorative film 10d is observed from the front surface side, the scene of the other side of the transmission decorative film 10d is visually recognized by the light transmitted and incident from the front surface side, and an image having a formation pattern according to the green left circular polarization reflection region 26lG of the second cholesteric liquid crystalline layer 26 is visually recognized.

That is, in a case where the transmission decorative film 10d is observed from the front surface side, a white pattern is visually recognized, but in a case where the transmission decorative film 10d is observed from the rear surface side, a green pattern is visually recognized, and the two colors at least have different hues.

Modification Example 1 of First, Second, and Third Embodiment

Another member may be disposed on the surface of the transmission decorative film of First, Second, and Third Embodiment. For example, a colorless and transparent base material may be disposed on the transmission decorative film of First, Second, and Third Embodiment. In a case where a colorless and transparent base material is disposed on the surface of the transmission decorative film of First, Second, and Third Embodiment, the colorless and transparent base material may be disposed on any surface thereof on the circular polarization reflection layer side and the circular polarization plate side. With the configuration described above, the colorless and transparent base material functions as a surface protective layer and a reinforcing effect or a peeling protection effect is obtained.

The material of the colorless and transparent base material is not particularly limited, and examples thereof include glass and plastic.

Examples of plastic include a cellulose-based polymer, a polycarbonate-based polymer, a polyester-based polymer, a (meth)acrylic polymer, a styrene-based polymer, a polyolefin-based polymer, a vinyl chloride-based polymer, an amide-based polymer, an imide-based polymer, a sulfone-based polymer, a polyether sulfone-based polymer, and a polyether ether ketone-based polymer, and among these, polyethylene terephthalate (PET), or a (meth)acrylic polymer is preferable.

The "colorless and transparent base material" means a transparent base material which substantially does not perform absorption in a visible light region, and an average transmittance in a wavelength range of 380 to 780 nm is preferably equal to or greater than 80% and more preferably equal to or greater than 90%.

A thickness of the colorless and transparent base material is not particularly limited, and is preferably 1 to 100 μm and more preferably 2 to 50 μm. The colorless and transparent base material is preferably bonded to the transmission decorative film through a commercially available pressure sensitive adhesive.

In a method of manufacturing a transmission decorative film which will be described later, a base material film used as a temporary base material in a case of forming the first cholesteric liquid crystalline layer, may be set as the colorless and transparent base material. That is, after forming the first cholesteric liquid crystalline layer on the base material film, the first cholesteric liquid crystalline layer is laminated on the circular polarization plate with the base material film, without peeling the first cholesteric liquid crystalline layer from the base material film, and the base material film may be used as a surface protective layer of the transmission decorative film.

(Modification Example 2 of First, Second, and Third Embodiment)

In addition, in First, Second, and Third Embodiments, the aspect in which the first cholesteric liquid crystalline layer or the circular polarization reflection layer is disposed so as to cover the entire region of the circular polarization plate, but the aspect is not limited thereto, and the first cholesteric liquid crystalline layer or the circular polarization reflection layer may be disposed only in a partial region on the circular polarization plate. For example, the transmission decorative film 10a shown in FIG. 1 may have a configuration in which the first cholesteric liquid crystalline layer 14 is disposed only in a partial region on the circular polarization plate 12. Hereinafter, this will be described as a transmission decorative film 10e.

Figure 9:
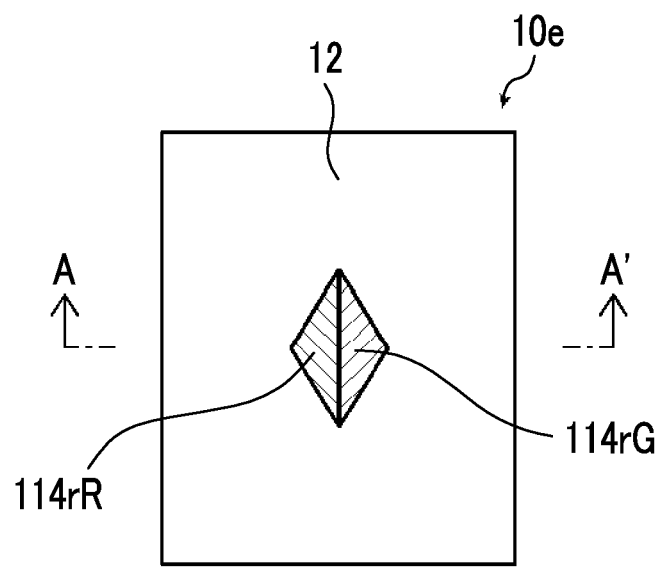
FIG. 9 is a schematic view showing another example of the embodiment of the transmission decorative film of the present invention.

The transmission decorative film 10e is visually recognized as shown in FIG. 9, in a case where the transmission decorative film 10e is observed from the front surface side. A first cholesteric liquid crystalline layer 114 includes a red right circular polarization reflection region 114rR and a green right circular polarization reflection region 114rG. The transmission decorative film 10e has the same configuration as the transmission decorative film 10a, except that the first cholesteric liquid crystalline layer 114 is disposed only in a partial region on the circular polarization plate 12.

Figure 10:
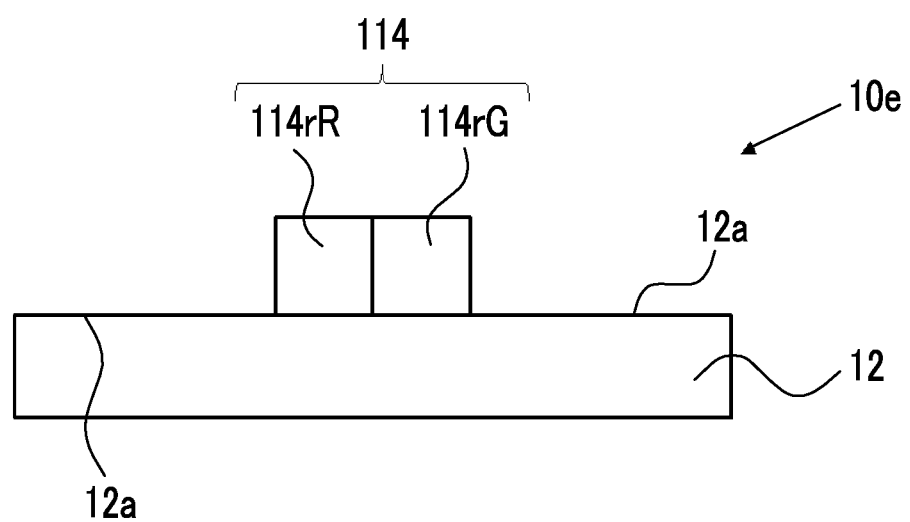
FIG. 10 is a cross section schematic view of the transmission decorative film taken along line A-A' shown in FIG. 9.

Meanwhile, since the transmission decorative film 10e includes the first cholesteric liquid crystalline layer 114 only in a partial region on the circular polarization plate 12, a difference in film thickness for the amount of the film thickness of the first cholesteric liquid crystalline layer 114 is generated between a exposed surface 12a of the circular polarization plate 12 and the front surface of the first cholesteric liquid crystalline layer 114, as shown in the cross section schematic view of FIG. 10. Accordingly, the outline of the first cholesteric liquid crystalline layer 114 may be visually recognized from the rear surface due to this difference in film thickness.

Figure 11:
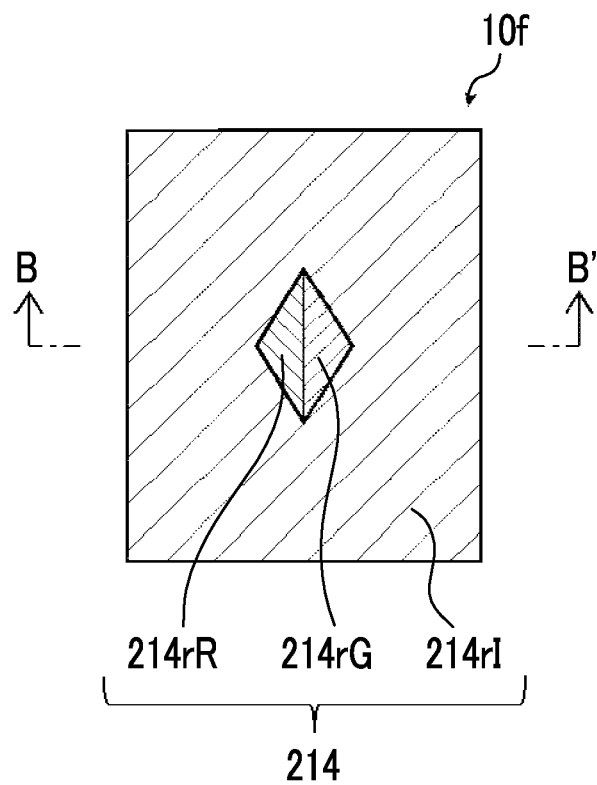
FIG. 11 is a schematic view showing another example of the embodiment of the transmission decorative film of the present invention.
Figure 12:
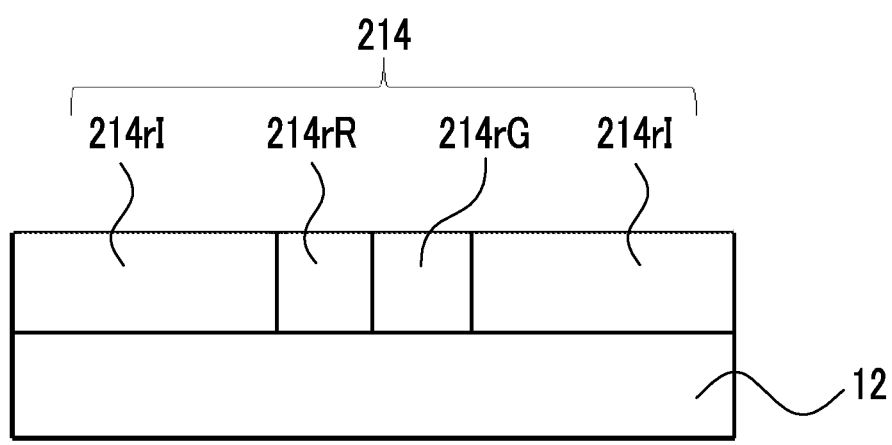
FIG. 12 is a cross section schematic view of the transmission decorative film taken along line B-B' shown in FIG. 11.

Therefore, in order to prevent the outline of the first cholesteric liquid crystalline layer 114 from being visually recognized from the rear surface, it is desired that a first cholesteric liquid crystalline layer 214 of the transmission decorative film is disposed over the entire region of the circular polarization plate 12 so that the film thickness substantially becomes the same, as a transmission decorative film 10f shown in FIGS. 11 and 12. In the transmission decorative film 10f, the first cholesteric liquid crystalline layer 214 includes a red right circular polarization reflection region 214rR, a green right circular polarization reflection region 214rG, and an infrared right circular polarization reflection region 214rI which transmits left circularly polarized infrared light and transmits light in other wavelength ranges. The transmission decorative film 10f has the same configuration as the transmission decorative film 10e, except that the infrared right circular polarization reflection region 214rI is included.

In addition, as the transmission decorative film 10e, in a case where a difference in haze is great between a region where the first cholesteric liquid crystalline layer 114 is provided and a region on the exposed surface 12a of the circular polarization plate 12 where the first cholesteric liquid crystalline layer is not provided, the display on the surface may not be recognized, in a case where the transmission decorative film is observed from the rear surface. Accordingly, as the transmission decorative film 10f shown in FIGS. 11 and 12, in a case where the first cholesteric liquid crystalline layer 214 is disposed over the entire region of the circular polarization plate 12 so that the film thickness substantially becomes the same, the difference in haze can be decreased, and therefore, it is possible to prevent the outline of the first cholesteric liquid crystalline layer 114 from being recognized from the rear surface. A difference in haze is preferably small, more preferably equal to or smaller than 3%, even more preferably equal to or smaller than 2%, and still more preferably equal to or smaller than 1%.

Modification Example 3 of First, Second, and Third Embodiment

As described above, the first cholesteric liquid crystalline layer of the transmission decorative film of the present invention may be the first cholesteric liquid crystalline layer having the alignment defect of the liquid crystal compound. The transmission decorative film including the first cholesteric liquid crystalline layer having the alignment defect has light diffusibility (light scattering). As the first cholesteric liquid crystalline layer has light diffusibility (light scattering), visibility can be increased.

Figure 13:
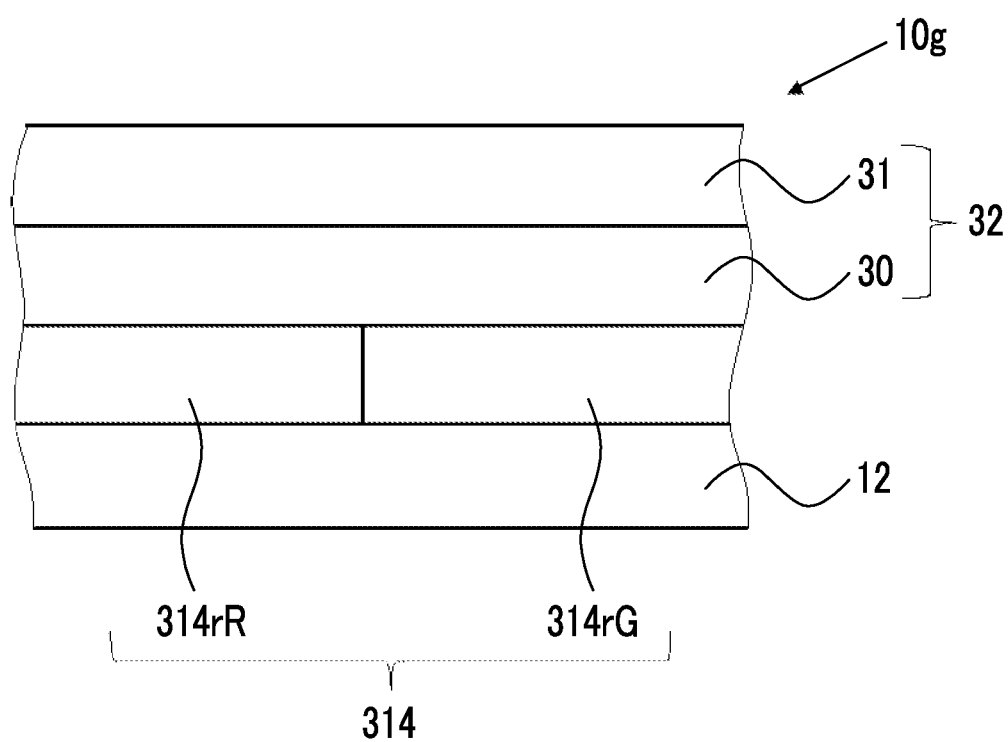
FIG. 13 is a schematic view showing another example of the embodiment of the transmission decorative film of the present invention.

FIG. 13 shows a transmission decorative film 10g including a first cholesteric liquid crystalline layer having a defect in alignment of a liquid crystal compound.

The transmission decorative film 10g shown in FIG. 13 the circular polarization plate 12, a first cholesteric liquid crystalline layer 314 which is disposed on the circular polarization plate 12 and reflects right circularly polarized light, an alignment adjusting layer 30 disposed on the first cholesteric liquid crystalline layer 314, and a surface protective layer 31, in this order. In addition, in the first cholesteric liquid crystalline layer 314, a red right circular polarization reflection region 314rR and a green right circular polarization reflection region 314rG are formed in a desired pattern.

The transmission decorative film 10g has the same configuration as the transmission decorative film 10a, except that the first cholesteric liquid crystalline layer 314 is a scattering type and the alignment adjusting layer 30 and the surface protective layer 31 are included. The surface protective layer 31 is the same as the colorless and transparent base material described in the modification example 1 and the preferable aspect is also the same.

The alignment adjusting layer 30 will be described later with a method of manufacturing the transmission decorative film 10g. In addition, as will be described later, the first cholesteric liquid crystalline layer 314 is formed on the alignment adjusting layer 30.

Hereinafter, each member configuring the transmission decorative film will be described.

(Circular Polarization Reflection Layer and Cholesteric Liquid Crystalline Layer)

The circular polarization reflection layer includes at least one or more first cholesteric liquid crystalline layers.

The cholesteric liquid crystalline layer is a layer including a cholesteric liquid crystalline phase. The cholesteric liquid crystalline layer is preferably a layer formed with a fixed cholesteric liquid crystalline phase, but there is no limitation. In a case of displaying a still image, a layer formed with a fixed cholesteric liquid crystalline phase is preferable, and in a case of displaying a motion picture, it is preferable that the cholesteric liquid crystalline phase is not fixed.

The configuration in which the cholesteric liquid crystalline phase is fixed may be a structure in which the alignment of the liquid crystal compound becoming the cholesteric liquid crystalline phase is maintained. And the structure may be a structure in which, typically, a polymerizable liquid crystal compound is set in an alignment state of a cholesteric liquid crystalline phase, polymerized and cured by ultraviolet light irradiation or heating, to form a layer not having fluidity, and at the same time, the alignment aspect is changed to a state which does not change due to the external field or the external force. In the structure in which the cholesteric liquid crystalline phase is fixed, it is enough, as long as the optical properties of the cholesteric liquid crystalline phase are maintained, and the liquid crystal compound may not have liquid crystal properties. For example, the polymerizable liquid crystal compound may lose liquid crystal properties due to an increase in molecular weight due to a curing reaction.

As the material used in the formation of the cholesteric liquid crystalline layer, a liquid crystal composition including a liquid crystal compound or the like is used. The liquid crystal compound is preferably a liquid crystal compound having a polymerizable group (polymerizable liquid crystal compound).

The liquid crystal composition including a polymerizable liquid crystal compound may further include a surfactant, a chiral agent, or a polymerization initiator. Hereinafter, each component will be described.

——Polymerizable Liquid Crystal Compound——

The polymerizable liquid crystal compound may be a rod-like liquid crystal compound or a disk-like liquid crystal compound, and a rod-like liquid crystal compound is preferably used.

As an example of a rod-like polymerizable liquid crystal compound for forming the cholesteric liquid crystalline layer, a rod-like nematic liquid crystal compound may be used. As a rod-like nematic liquid crystal compound, azomethines, azoxys, cyano biphenyls, cyanophenyl esters, benzoic acid esters, cyclohexane carboxylic acid phenyl esters, cyanophenyl cyclohexanes, cyano-substituted phenyl pyrimidines, alkoxy-substituted phenyl pyrimidines, phenyl dioxanes, tolanes, and alkenylcyclohexylbenzonitriles are preferably used. Not only a low-molecular-weight liquid crystal compound, but also a high-molecular-weight liquid crystal compound can be used.

A polymerizable liquid crystal compound is obtained by introducing a polymerizable group to the liquid crystal compound. Examples of the polymerizable group include an unsaturated polymerizable group, an epoxy group, and an aziridinyl group, an unsaturated polymerizable group is preferable and an ethylenically unsaturated polymerizable group is more preferable. The polymerizable group can be introduced into molecules of the liquid crystal compound by various methods. The number of polymerizable groups included in the polymerizable liquid crystal compound is preferably 1 to 6 and more preferably 1 to 3. Examples of the polymerizable liquid crystal compound include compounds disclosed in Makromol. Chem., vol. 190, 2255 p, (1989), Advanced Materials, vol. 5, 107 p (1993), U.S. Pat. Nos. 4,683,327A, 5,622,648A, 5,770,107A, WO95/022586A, WO95/024455A, WO97/000600A, WO98/023580A, WO98/052905A, JP1989-272551A (JP-H01-272551A), JP1994-016616A (JP-H06-016616A), JP1995-110469A (JP-H07-110469A), JP1999-080081A (JP-H11-080081A), and JP2001-328973A. Two or more kinds of polymerizable liquid crystal compounds may be used in combination. In a case where two or more kinds of polymerizable liquid crystal compounds are used in combination, it is possible to decrease an alignment temperature.

Specific examples of the polymerizable liquid crystal compound include compounds shown in Formulae (1) to (11).

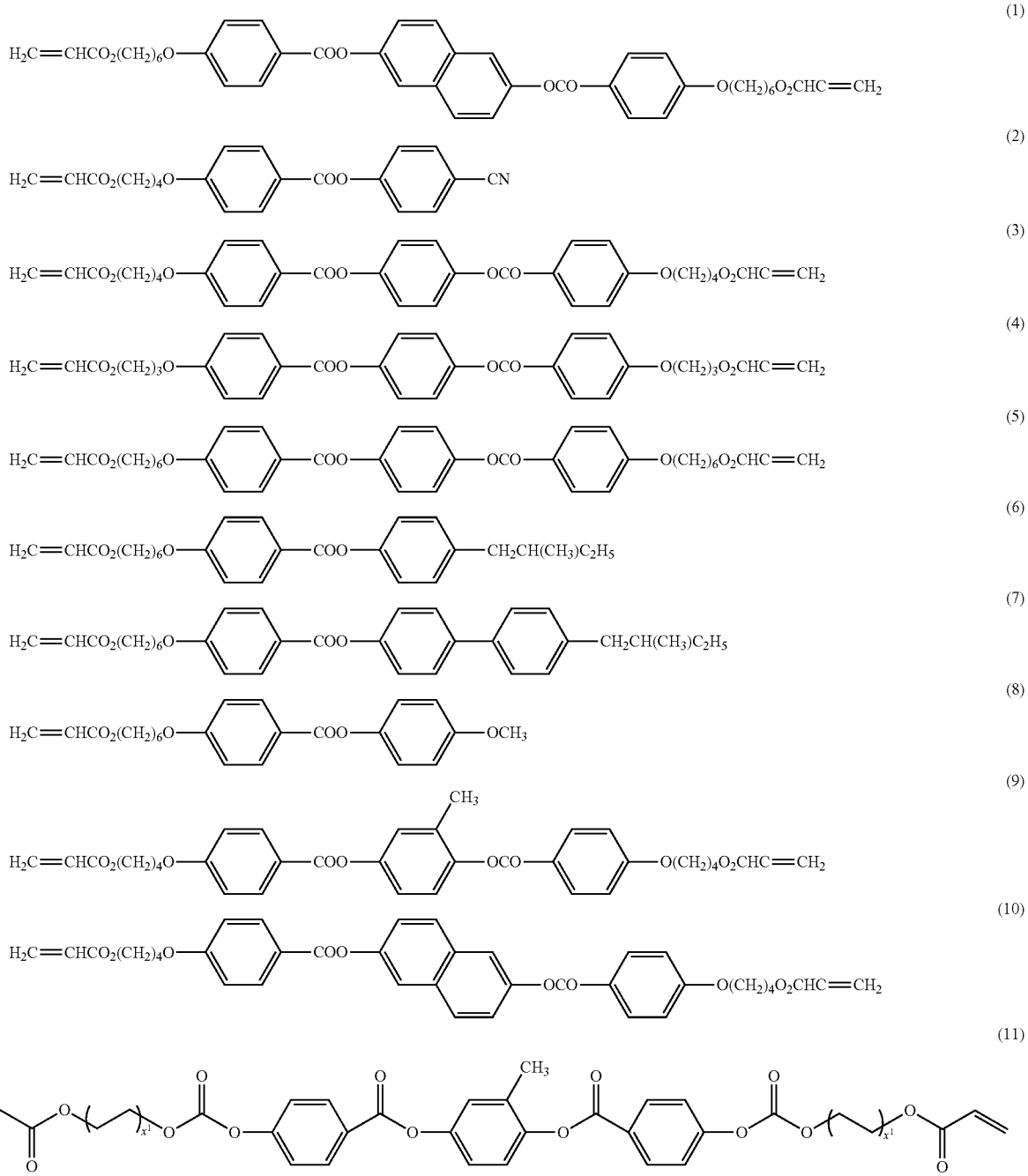

[In the compound (11), $X^1$ is 2 to 5 (integer).]

In addition, as the polymerizable liquid crystal compound other than the polymerizable liquid crystal compound described above, a cyclic organopolysiloxane compound including a cholesteric phase disclosed in JP1982-165480A (JP-S57-165480A) can be used. Further, as the high-molecular-weight liquid crystal compound described above, a polymer obtained by introducing a mesogenic group having liquid crystal to a main chain, a side chain, or both positions of the main chain and the side chain, a high-molecular-weight cholesteric liquid crystal obtained by introducing a cholesteric group to a side chain, a liquid crystal polymer disclosed in JP1997-133810A (JP-H09-133810A), and a liquid crystal polymer disclosed in JP1999-293252A (JP-H11-293252A) can be used.

In addition, the added amount of the polymerizable liquid crystal compound in the liquid crystal composition is preferably 75% to 99.9% by mass, more preferably 80% to 99% by mass, and even more preferably 85% to 90% by mass, with respect to the solid content mass (mass excluding the solvent) of the liquid crystal composition.

——Chiral Agent (Optically Active Compound)——

The chiral agent has a function of inducing the helical structure of the cholesteric liquid crystalline phase. Since the induced twisted direction of the helix or the helical pitch varies according to the compound, the chiral compound may be selected according to the purpose.

The chiral agent is not particularly limited, and well-known compounds (for example, Liquid Crystal Device Handbook, third vol. paragraphs 4-3, a chiral agent for twisted nematic (TN) or super-twisted nematic (STN), p. 199, Japan Society for the Promotion of Science 142th Committee Edition, 1989), isosorbide, or an isomannide derivative can be used.

The chiral agent generally includes asymmetric carbon atoms, but an axial asymmetric compound or a planar asymmetric compound not including asymmetric carbon atoms can be used as the chiral agent. As an example of an axial asymmetric compound or a planar asymmetric compound, binaphthyl, helicene, paracyclophane, and derivatives thereof are included. The chiral agent may include a polymerizable group. In a case where both of the chiral agent and the liquid crystal compound include a polymerizable group, it is possible to form a polymer including a repeating unit derived from the polymerizable liquid crystal compound and a repeating unit derived from the chiral agent, by the polymerization reaction between the polymerizable chiral agent and the polymerizable liquid crystal compound. In this aspect, the polymerizable group included in the polymerizable chiral agent is preferably the same kind of group as the polymerizable group included in the polymerizable liquid crystal compound. Accordingly, the polymerizable group of the chiral agent is preferably an unsaturated polymerizable group, an epoxy group, or an aziridinyl group, more preferably an unsaturated polymerizable group, and particularly preferably an ethylenically unsaturated polymerizable group.

In addition, the chiral agent may be a liquid crystal compound.

As will be described later, in a case of controlling a size of the helical pitch of the cholesteric liquid crystalline phase in accordance with the exposed amount, in a case of manufacturing the cholesteric liquid crystalline layer, a chiral agent sensitive to light and capable of changing the helical pitch of the cholesteric liquid crystalline phase (hereinafter, also referred to as a photosensitive chiral agent) is preferably used.

The photosensitive chiral agent is a compound, the structure of which is changed by absorbing light, and which changes the helical pitch of the cholesteric liquid crystalline phase. As such a compound, a compound which causes at least one of a photoisomerization reaction, a photo dimerization reaction, and a photodegradation reaction is preferable.

The compound causing the photoisomerization reaction is a compound causing stereoisomerization or structure isomerization reaction by the operation of light. Examples of the photoisomerization compound include an azobenzene compound, and a spiropyran compound.

In addition, the compound causing the photo dimerization reaction is a compound which cyclizes by causing an addition reaction between two groups due to the light irradiation. Examples of the photo dimerization compound include a cinnamic acid derivative, a coumarin derivative, a chalcone derivative, and a benzophenone derivative.

As the photosensitive chiral agent, a chiral agent represented by General Formula (I) is preferably used. This chiral agent may change an alignment structure of the helical pitch (twisting force or angle of twist of helix) of the cholesteric liquid crystalline phase in accordance with light intensity during the light irradiation.

General Formula (I)

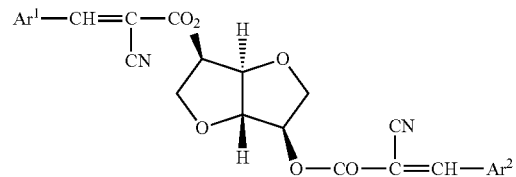

In General Formula (I), $Ar^1$ and $Ar^2$ represent an aryl group or a heteroaromatic ring group.

The aryl group represented by $Ar^1$ and $Ar^2$ may include a substituent, a total number of carbon atoms is preferably 6 to 40 and more preferably 6 to 30. As the substituent, for example, a halogen atom, an alkyl group, an alkenyl group, an alkynyl group, an alkoxy group, a hydroxyl group, an acyl group, an alkoxycarbonyl group, an aryloxycarbonyl group, an acyloxy group, a carboxyl group, a cyano group, or a heterocyclic group is preferable, and a halogen atom, an alkyl group, an alkenyl group, an alkoxy group, a hydroxyl group, an acyloxy group, an alkoxycarbonyl group, or an aryloxycarbonyl group is more preferable.

Among such aryl groups, an aryl group represented by General Formula (III) or (IV) is preferable.

General Formula (III)

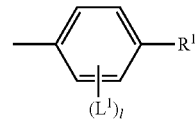

General Formula (IV)

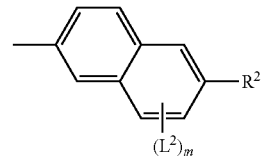

$R^1$ in General Formula (III) and $R^2$ in General Formula (IV) each independently represent a hydrogen atom, a halogen atom, an alkyl group, an alkenyl group, an alkynyl group, an aryl group, a heterocyclic group, an alkoxy group, a hydroxyl group, an acyl group, an alkoxycarbonyl group, an aryloxycarbonyl group, an acyloxy group, a carboxyl group, or a cyano group. Among these, a hydrogen atom, a halogen atom, an alkyl group, an alkenyl group, an aryl group, an alkoxy group, a hydroxyl group, an alkoxycarbonyl group, an aryloxycarbonyl group, or an acyloxy group is preferable, and an alkoxy group, a hydroxyl group, or an acyloxy group is more preferable.

$L^1$ in General Formula (III) and $L^2$ in General Formula (IV) each independently represent a halogen atom, an alkyl group, an alkoxy group, or a hydroxyl group, and an alkoxy group having 1 to 10 carbon atoms or a hydroxyl group is preferable.

l represents an integer of 0, 1 to 4 and 0 or 1 is preferable. m represents an integer of 0, 1 to 6 and 0 or 1 is preferable. In a case where l or m is equal to or greater than 2, $L^1$ and $L^2$ may represent groups different from each other.

A heteroaromatic ring group represented by $Ar^1$ and $Ar^2$ may include a substituent, and a total number of carbon atoms is preferably 4 to 40 and more preferably 4 to 30. As the substituent, for example, a halogen atom, an alkyl group, an alkenyl group, an alkynyl group, an aryl group, an alkoxy group, a hydroxyl group, an acyl group, an alkoxycarbonyl group, an aryloxycarbonyl group, an acyloxy group, or a cyano group is preferable, and a halogen atom, an alkyl group, an alkenyl group, an aryl group, an alkoxy group, or an acyloxy group is more preferable.

Examples of the heteroaromatic ring group include a pyridyl group, a pyrimidinyl group, a furyl group, and a benzofuranyl group, and among these, a pyridyl group or a pyrimidinyl group is preferable.

A content of the chiral agent in the liquid crystal composition is preferably 0.01 to 200 mol % and more preferably 1 to 30 mol % with respect to the amount of the polymerizable liquid crystal compound.

——Polymerization Initiator——

In a case where the liquid crystal composition includes the polymerizable compound, the liquid crystal composition preferably includes a polymerization initiator. In an aspect of causing the polymerization reaction to proceed using the ultraviolet light irradiation, the polymerization initiator used is preferably a photopolymerization initiator which can start the polymerization reaction by an ultraviolet light irradiation. Examples of the photopolymerization initiator include an α-carbonyl compound (disclosed in each specification of U.S. Pat. Nos. 2,367,661A and 2,367,670A), acyloin ether (disclosed in the specification of U.S. Pat. No. 2,448,828A), an α-hydrocarbon-substituted aromatic acyloin compound (disclosed in the specification of U.S. Pat. No. 2,722,512A), a polynuclear quinone compound (disclosed in each specification of U.S. Pat. Nos. 3,046,127A and 2,951,758A), a combination of a triaryl imidazole dimer and p-amino phenyl ketone (disclosed in the specification of U.S. Pat. No. 3,549,367A), acridine and phenazine compounds (disclosed in each specification of JP1985-105667A (JP-S60-105667A) and U.S. Pat. No. 4,239,850A), and an oxadiazole compound (disclosed in the specification of U.S. Pat. No. 4,212,970A).

A content of the photopolymerization initiator in the liquid crystal composition is preferably 0.1% to 20% by mass and more preferably 0.5% by mass to 12% by mass, with respect to the content of the polymerizable liquid crystal compound.

——Cross-Linking Agent——

The liquid crystal composition may randomly include a cross-linking agent, in order to improve film hardness after the curing and durability. As the cross-linking agent, a material which is cured by ultraviolet light, heat, or humidity can be suitably used.

The cross-linking agent is not particularly limited and can be suitably selected according to the purpose, and examples thereof include a polyfunctional acrylate compound such as trimethylolpropane tri(meth)acrylate or pentaerythritol tri (meth)acrylate; an epoxy compound such as glycidyl (meth) acrylate or ethylene glycol diglycidyl ether; an aziridine compound such as 2,2-bishydroxymethylbutanol-tris[3-(1-aziridinyl)propionate] or 4,4-bis (ethylene iminocarbonyl amino)diphenylmethane; an isocyanate compound such as hexamethylene diisocyanate or biuret type isocyanate; a polyoxazoline compound including an oxazoline group as a side chain; and an alkoxysilane compound such as vinyltrimethoxysilane or N-(2-aminoethyl)3-aminopropyltrimethoxysilane. In addition, a well-known catalyst can be used according to the reactivity of the cross-linking agent and it is possible to improve productivity, in addition to the improvement of film hardness and durability. These may be used alone or in combination of two or more kinds thereof.

A content of the cross-linking agent is preferably 3% by mass to 20% by mass and more preferably 5% by mass to 15% by mass.

——Other Additives——

If necessary, a surfactant, a polymerization inhibitor, an antioxidant, a horizontal alignment agent, an ultraviolet absorbing agent, a light stabilizer, a coloring material, and metal oxide fine particles can be added to the liquid crystal composition, in a range not decreasing the optical performance.

The liquid crystal composition may include a solvent. The solvent is not particularly limited and can be suitably selected according to the purpose, and an organic solvent is preferable.

The organic solvent is not particularly limited and can be suitably selected according to the purpose, and examples thereof include ketones such as methyl ethyl ketone, methyl isobutyl ketone alkyl halides, amides, sulfoxides, heterocyclic compounds, hydrocarbons, esters, and ethers. These may be used alone or in combination of two or more kinds thereof.

<Method of Manufacturing Transmission Decorative Film>

The method of manufacturing the transmission decorative film is not particularly limited, and a well-known method can be used.

For example, a method of forming a cholesteric liquid crystalline layer on a temporary base material, and then, transferring the cholesteric liquid crystalline layer on a circular polarization plate through a pressure sensitive adhesive layer is used.

As the method of forming the cholesteric liquid crystalline layer, a manufacturing method including the following step 1 to step 4 is preferable, from a viewpoint of ease of control of the helical pitch of the cholesteric liquid crystalline phase.

Step 1: step of forming a coating by using a liquid crystal composition including a liquid crystal compound including a polymerizable group and a chiral agent sensitive to light and capable of changing a helical pitch of a cholesteric liquid crystalline phase Step 2: step of performing an exposure treatment on the coating in a pattern shape, with light to which the chiral agent is sensitive Step 3: step of performing a heating treatment on the coating subjected to the exposure treatment and aligning the liquid crystal compound to be in a state of a cholesteric liquid crystalline phase Step 4: step of performing a curing treatment on the coating subjected to the heating treatment and forming the first cholesteric liquid crystalline layer formed by fixing the cholesteric liquid crystalline phase Hereinafter, the procedure of each step will be described with reference to the drawings.

(Step 1)

The step 1 is a step of forming a coating using a liquid crystal composition including a liquid crystal compound including a polymerizable group, and a chiral agent sensitive to light and capable of changing a helical pitch of a cholesteric liquid crystalline phase. As shown in S1 of FIG. 14, first, a coating 13*a* is formed by performing this step.

From a viewpoint of setting a circular polarization reflection layer having more excellent alignment properties and high transmittance, the alignment treatment may be performed with respect to a surface of a base material, before forming the coating. By performing the alignment treatment, it is possible to improve alignment properties of the cholesteric liquid crystalline phase formed on the coating and further increase transmittance of the transmission decorative film. As the base material, a temporary base material (transfer base material) is used. The cholesteric liquid crystalline layer may be directly formed on the circular polarization plate by using the circular polarization plate as the base material.

The liquid crystal compound including the polymerizable group included in the liquid crystal composition and the photosensitive chiral agent are as described above. The component which may be included in the liquid crystal composition is also as described above.

A concentration of solid contents of the liquid crystal composition is preferably 10% to 50% by mass and more preferably 20% to 40% by mass with respect to a total mass of the liquid crystal composition, from a viewpoint of coating properties.

As a method of forming the coating in the step 1, a method of applying the liquid crystal composition onto the base material is used. The coating method is not particularly limited, and examples thereof include a wire bar coating method, an extrusion coating method, a direct gravure coating method, a reverse gravure coating method, and a die-coating method.

If necessary, a process of drying the liquid crystal composition applied onto the base material may be performed after the applying. By performing the drying process, the solvent can be removed from the applied liquid crystal composition.

A film thickness of the coating is not particularly limited, and is preferably 0.1 to 20 µm, more preferably 0.2 to 15 µm, even more preferably 0.5 to 10 µm, from a viewpoint of more excellent reflectivity of the cholesteric liquid crystalline layer.

(Step 2)

The step 2 is a step of performing an exposure treatment with respect to the coating in a pattern shape, with light to which the chiral agent is sensitive. By performing this step, a difference can be provided between a helical induction force of the chiral agent in an exposure region and a helical induction force of the chiral agent in a non-exposure region. Accordingly, by further performing the procedure which will be described later, the reflection regions having different selective reflection wavelengths can be formed.

A method of performing the exposure treatment in a pattern shape is not particularly limited, and a method using a mask having an opening is used. More specifically, as shown in S2 of FIG. 14, the exposure is performed with respect to the coating 13*a* with light at a wavelength which is emitted by a light source S and to which the photosensitive chiral agent is sensitive, through a mask M having a predetermined opening pattern, and a partially exposed coating 13*b* is formed.

The wavelength of light emitted in this step is not particularly limited, as long as it is light at a wavelength to which the photosensitive chiral agent is sensitive.

In a case where the polymerization initiator is included in the liquid crystal composition, it is preferable to perform the exposure with light at a wavelength to which the polymerization initiator is hardly sensitive.

In a case of the light irradiation, the coating may be heated. A heating temperature is preferably 15° C. to 50° C. and more preferably 20° C. to 40° C.

Figure 14:
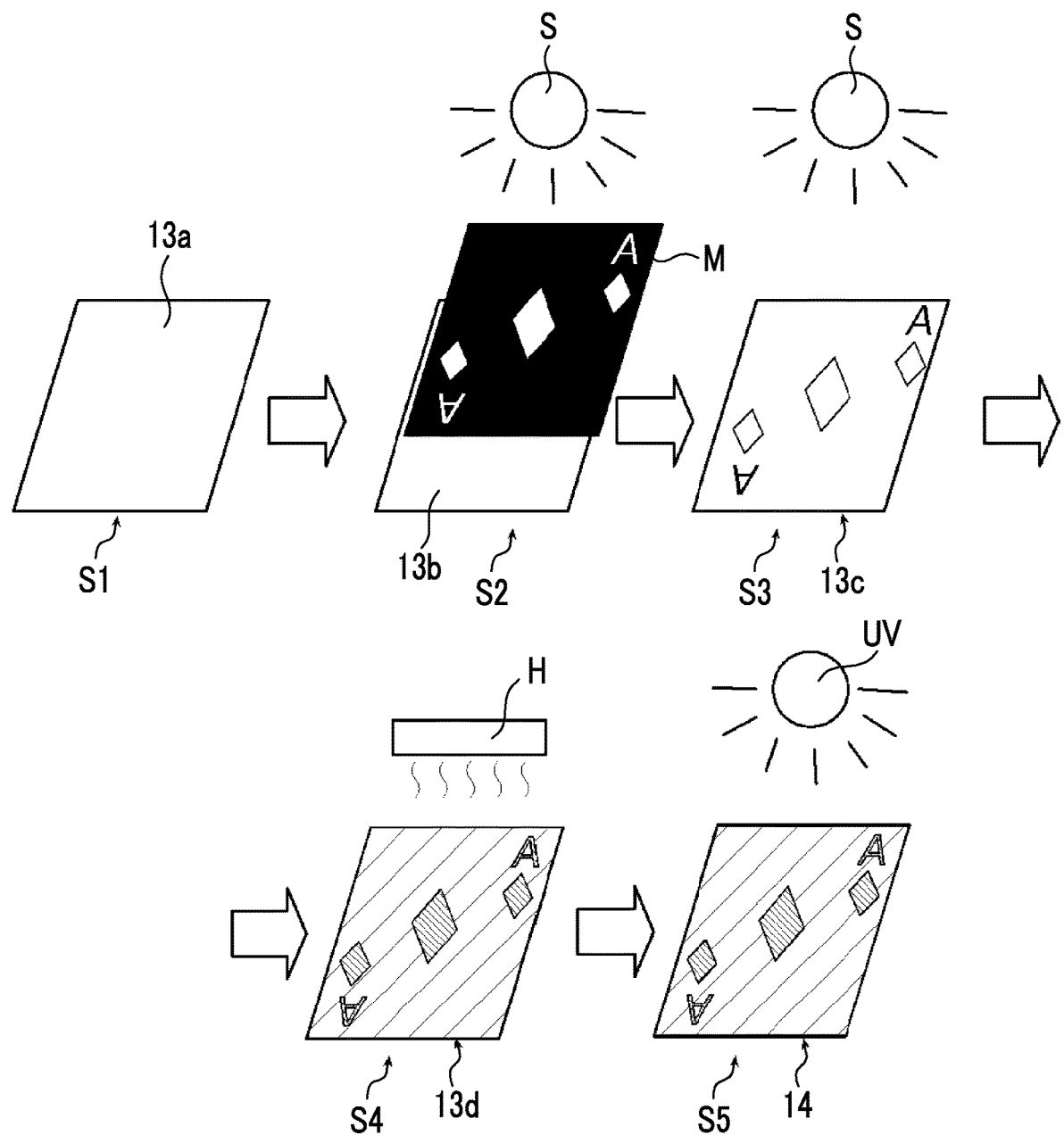
FIG. 14 is a schematic view for describing an example of a method of manufacturing a cholesteric liquid crystalline layer.

After performing the step 2, if necessary, as shown in S3 of FIG. 14, the entire surface of the coating may be irradiated with the light at a wavelength to which the photosensitive chiral agent is sensitive to obtain the entirely exposed coating 13*c*. By performing this step, a helical induction force can be adjusted so as to obtain a predetermined helical pitch, by sensing the chiral agent in the non-exposure region in the step 2.

(Step 3)

The step 3 is a step of performing a heating treatment with respect to the coating subjected to the exposure treatment in the step 2 and aligning the liquid crystal compound to be in a state of a cholesteric liquid crystalline phase. By performing this step, as shown in S4 of FIG. 14, a coating 13*d* in a state of the cholesteric liquid crystalline phase can be formed by the heating treatment using a heater H or the like.

A liquid crystal phase transition temperature of the liquid crystal composition is preferably 10° C. to 250° C. and more preferably 10° C. to 150° C., from a viewpoint of manufacturing suitability.

As the preferable heating conditions, the liquid crystal composition is preferably heated at 40° C. to 100° C. (preferably 60° C. to 100° C.) for 0.5 to 5 minutes (preferably 0.5 to 2 minutes).

(Step 4)

The step 4 is a step of performing a curing treatment with respect to the coating subjected to the heating treatment and forming the first cholesteric liquid crystalline layer formed by fixing the cholesteric liquid crystalline phase.

The method of curing treatment is not particularly limited, and a photocuring treatment and a heat curing treatment are used. Among these, the light irradiation treatment is preferable, and as shown in S5 of FIG. 14, an ultraviolet irradiation treatment using a UV (ultraviolet) light source is more preferable. By performing this step, the first cholesteric liquid crystalline layer 14 formed by fixing the cholesteric liquid crystalline phase is formed.

In the ultraviolet light irradiation, a light source such as an ultraviolet lamp is used. An irradiation energy of ultraviolet light is not particularly limited, and is generally preferably approximately 0.1 to 0.8 J/cm$^2$. In addition, the time for emitting the ultraviolet light is not particularly limited, and may be suitably determined, from viewpoints of hardness of a reflection layer to be obtained and productivity.

In a case of manufacturing a transmission decorative film including a circular polarization reflection layer including a plurality of cholesteric liquid crystalline layers or a circular polarization reflection layer including a first cholesteric liquid crystalline layer and a second cholesteric liquid crystalline layer, the steps 1 to 4 may be repeated.

The second cholesteric liquid crystalline layer is a layer which reflects circularly polarized light having a revolution direction opposite to that of the circularly polarized light reflected by the first cholesteric liquid crystalline layer. In a case of manufacturing a transmission decorative film including a circular polarization reflection layer including a first cholesteric liquid crystalline layer and a second cholesteric liquid crystalline layer, a method of forming the second cholesteric liquid crystalline layer is not particularly limited.

From a viewpoint of causing the display on the surface not to be visually recognized from the rear surface of the transmission decorative film, in a case where the transmission decorative film is observed from the rear surface, a difference in film thickness is preferably small in two or more reflection regions having different selective reflection wavelengths of the cholesteric liquid crystalline layer. In a case where there is a difference in film thickness in two or more reflection regions having different selective reflection wavelengths, a boundary line of each region may be observed from the rear surface of the transmission decorative film.

According to the method of forming each region from the coating described above, a difference in film thickness in two or more reflection regions having different selective reflection wavelengths is not substantially generated, and accordingly, a boundary line of each region is not observed from the rear surface of the transmission decorative film.

In addition, from a viewpoint of causing the display on the surface not to be visually recognized from the rear surface of the transmission decorative film, a difference in haze is preferably small in two or more reflection regions having different selective reflection wavelengths of the cholesteric liquid crystalline layer. In a case where there is a difference in haze in two or more reflection regions having different selective reflection wavelengths, a boundary line of each region may be observed from the rear surface of the transmission decorative film.

According to the method of forming each region from the coating described above, a difference in haze in two or more reflection regions having different selective reflection wavelengths is not substantially generated, and accordingly, a boundary line of each region is not observed from the rear surface of the transmission decorative film. A small difference in haze is preferable, and is more preferably equal to or smaller than 3%, even more preferably equal to or smaller than 2%, and still more preferably equal to or smaller than 1%.

In addition, as a method of forming the cholesteric liquid crystalline layer, a laser direct writing exposure apparatus can be used. The cholesteric liquid crystalline layer having a predetermined pattern can be obtained by adjusting the exposed amount, the number of times of exposure, the exposure time, and the like according to the position of the layer using the laser direct writing exposure apparatus, in a case of irradiating the non-cured cholesteric liquid crystalline layer (coating) with light.

In a case of forming the cholesteric liquid crystalline layer not having the fixed cholesteric liquid crystalline phase, the manufacturing can be performed by the manufacturing method of performing the steps 1 to 3, without performing the step 4.

In addition, in a case of using the liquid crystal compound capable of being aligned at room temperature, the cholesteric liquid crystalline layer can be formed without performing the heating treatment of the step 3.

<Other Manufacturing Method of Transmission Decorative Film>

In addition, the manufacturing method including the steps 1 to 4 has been described as an example of the method of manufacturing the transmission decorative film, but other method may be used.

For example, a manufacturing method including a step of reflecting any one of left circularly polarized light or right circularly polarized light, preparing first cholesteric liquid crystalline layers having a plurality of colors and having predetermined selective reflection wavelengths, and cutting out the first cholesteric liquid crystalline layers having a plurality of colors to a predetermined pattern to obtain first cholesteric liquid crystalline layer formation members, and a step of bonding the obtained first cholesteric liquid crystalline layer formation members having a plurality of colors onto a circular polarization plate may be used. The "plurality of colors" here means that the selective reflection wavelengths are different from each other.

Figure 15:
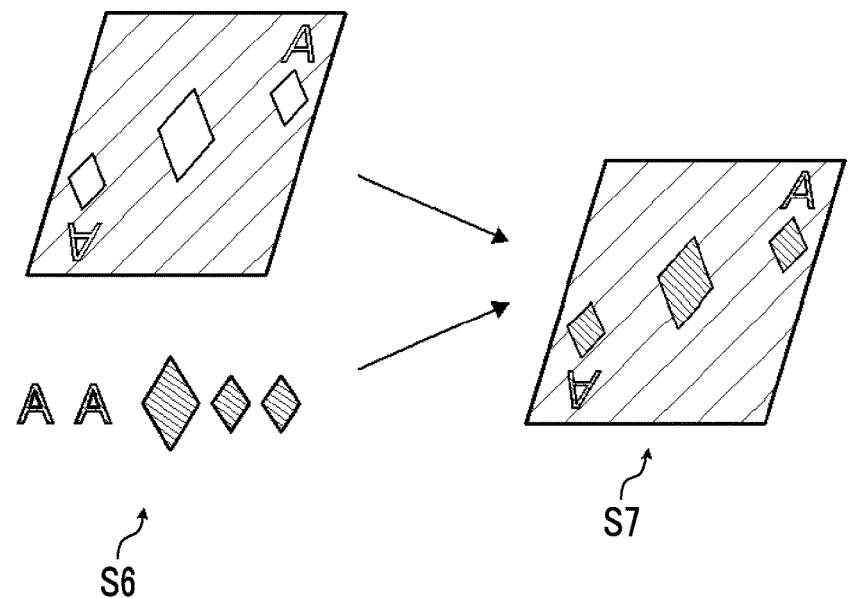
FIG. 15 is a schematic view for describing another example of the method of manufacturing a cholesteric liquid crystalline layer.

Specifically, in a case of manufacturing the transmission decorative film shown in FIG. 3, for example, as shown in S6 of FIG. 15, a red right circular polarization reflection member configuring the red right circular polarization reflection region 14rR and a green right circular polarization reflection member configuring the green right circular polarization reflection region 14rG are respectively prepared in the first cholesteric liquid crystalline layer 14, and as shown in S7 of FIG. 15, the transmission decorative film can be manufactured by bonding these to predetermined positions on the circular polarization plate.

In addition, in a case of manufacturing the transmission decorative film, a method of using two or more kinds of liquid crystal compositions capable of forming first cholesteric liquid crystalline layers having selective reflection wavelengths different from each other is also used. Hereinafter, a case of using two kinds of liquid crystal compositions will be described.

In this method, first, two kinds of liquid crystal compositions capable of forming first cholesteric liquid crystalline layers having selective reflection wavelengths different from each other are prepared. Specifically, a red right circular polarization reflection ink capable of forming first cholesteric liquid crystalline layer showing the same selective reflection wavelength as the red right circular polarization reflection region 14rR shown in FIG. 1, and a green right circular polarization reflection ink capable of forming first cholesteric liquid crystalline layer showing the same selective reflection wavelength as the green right circular polarization reflection region 14rG shown in FIG. 1 are respectively prepared. Each of the liquid crystal compositions includes at least a liquid crystal compound including a polymerizable group, and a chiral agent sensitive to light and capable of changing a helical pitch of a cholesteric liquid crystalline phase. The selective reflection wavelength of the first cholesteric liquid crystalline layer formed for each liquid crystal composition is adjusted to be different, by adjusting at least one of the kind of the liquid crystal compound used, the added amount of the chiral agent, or the kind of the chiral agent, for each liquid crystal composition.

Figure 16:
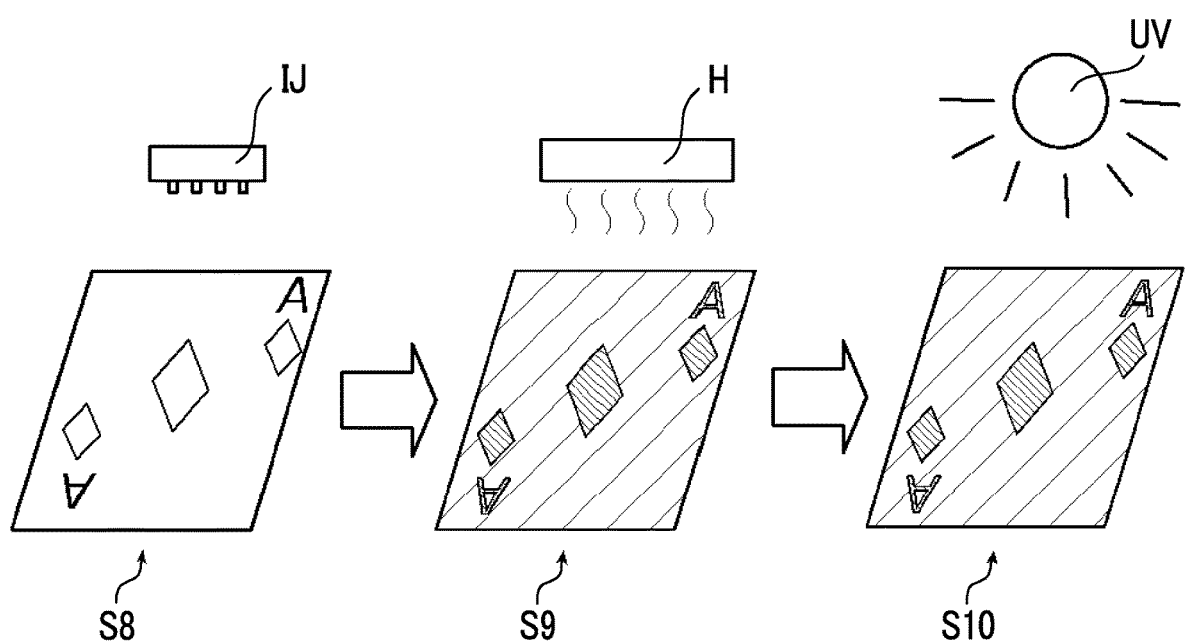
FIG. 16 is a schematic view for describing another example of the method of manufacturing a cholesteric liquid crystalline layer.

Next, as shown in S8 of FIG. 16, two kinds of the liquid crystal compositions are respectively applied to predetermined positions of the circular polarization plate. A method of applying the liquid crystal composition to the predetermined position of the circular polarization plate is not particularly limited and a well-known method is used. Specifically, an ink jet method or a flexographic printing method is used.

Next, as shown in S9 of FIG. 16, the heating treatment using a heater H is performed with respect to the coating disposed on the circular polarization plate, and the liquid crystal compound is aligned to set in a state of the cholesteric liquid crystalline phase. As the conditions of the heating treatment, the conditions of the step 3 described above are used.

After that, as shown in S10 of FIG. 16, the curing treatment is performed with respect to the coating subjected to the heating treatment, and the first cholesteric liquid crystalline layer formed by fixing the cholesteric liquid crystalline phase is formed. As the conditions of the curing treatment, the conditions of the step 4 described above are used.

The method of manufacturing the transmission decorative film may be a method obtained by combining the plurality of methods described above. For example, the first cholesteric liquid crystalline layer is only disposed in a partial region on the circular polarization plate by the flexographic printing method, and the first cholesteric liquid crystalline layer formation member obtained by cutting out the first cholesteric liquid crystalline layer having a predetermined selective reflection wavelength described above to a predetermined shape may be bonded to the other region on the circular polarization plate.

In addition, in a case of manufacturing the transmission decorative film in which the first cholesteric liquid crystalline layer or the circular polarization reflection layer is disposed only in a partial region on the circular polarization plate, the first cholesteric liquid crystalline layer or the circular polarization reflection layer can be disposed only in a predetermined position by using the method described above.

As a method of forming the first cholesteric liquid crystalline layer including two or more reflection regions having different selective reflection wavelengths, and the other well-known method disclosed in JP2009-300662A can be used.

<Other Method of Manufacturing Transmission Decorative Film (Method of Manufacturing Transmission Decorative Film Including Light Scattering Type First Cholesteric Liquid Crystalline Layer)>

The transmission decorative film 10g shown in FIG. 13 described above can be formed by forming a laminated film 32 by forming a cured layer including an alignment control agent (for example, horizontal alignment agent or the like) capable of adjusting the alignment of a first cholesteric liquid crystalline layer 314 which will be described later and which is the alignment adjusting layer 30, on a base material film which is the surface protective layer 31, performing the steps 1 to 4 described above by using the obtained laminated film 32 as a base material, and bonding the laminated film 32 on which the obtained first cholesteric liquid crystalline layer 314 is disposed, and the circular polarization plate 12 to each other.

The transmission decorative film 10g includes the cured layer including the alignment control agent capable of adjusting the alignment of the first cholesteric liquid crystalline layer, as the alignment adjusting layer 30, but the alignment adjusting layer 30 is not particularly limited, as long as it can adjust the alignment of the first cholesteric liquid crystalline layer 314. For example, the alignment adjusting layer 30 can be formed with a curable composition including at least a horizontal alignment agent, an acrylic resin, and a polymerization initiator.

[Usage]

The usage of the transmission decorative film is not particularly limited, and the transmission decorative film can be used, for example, as an advertising medium attached to a window glass as window advertisement of a building; a decorative material of an advertising medium attached to a window glass of a car, a taxi, a bus, or a train, or a lighting part of a car, a taxi, a bus, or a train; a traffic sign; a decorative material of a window glass of a house, a store, an aquarium, a zoo, a botanic garden, or a gallery; equipment for a stage or a theater; a decorative material of a transparent member of an elevator, an escalator, or stairs; toys such as a game machine or a card for a game; stationeries such as an underlay for a note; a fashion member of a bag, a cloth, goggles, or sunglasses; or a material of interior fabrics for wall or floor.

In addition to the usage described above, the transmission decorative film can also be used as point of purchase advertising (POP), a business card, a sticker, a postcard, a photo, a coaster, a ticket, a tent, a window blind, a shutter, a protective shield, a separator such as a partitioning screen, home appliances (for example, a camera, an instant camera, a personal computer (PC), a smart phone, a television, a recorder, a microwave oven, an audio player, a game machine, a virtual reality (VR) head set, a vacuum cleaner, a washing machine, and the like), a smart phone cover, a case for compact disc (CD) or a DVD, a stuffed toy, a cup, a dish, a plate, a pot, a vase, a desk, a chair, a book, a calendar, a pet bottle, a food packaging container, musical equipment such as a guitar or a piano, sporting goods such as a racket, a bat, a glove, or a ball, attractions of an amusement park such as a maze, a Ferris wheel, a roller coaster, or a ghost house, imitation flower, education toys, a product of a board game, a fan, a folding fan, an umbrella, a cane, a watch, a music box, accessories such as a necklace, a container of cosmetics, or a cover for a solar panel, an electric light, or a lamp.

In the example described above, the transmission decorative film displays a still image by the reflected light of the cholesteric liquid crystalline layer, but there is no limitation.

For example, by referring to methods disclosed in US2016/0033806A, JP5071388B, OPTICS EXPRESS 2016 vol. 24 No. 20 P23027-23036, the cholesteric liquid crystalline layer is not completely UV-cured and is set in a state where the alignment of the liquid crystalline phase of the cholesteric liquid crystalline layer can be changed due to a voltage application or a temperature change, and accordingly, a pattern of the cholesteric liquid crystalline layer is changed to change pictures and characters displayed, that is, a motion picture may be displayed.

EXAMPLES

Hereinafter, the present invention will be described more specifically with reference to examples. The material, the used amount, the rate, the processing details, and process procedures shown in the following examples can be suitably changed, as long as the gist of the present invention is not departed. Therefore, the scope of the present invention is not limitedly translated by the examples shown below.

(Preparation of Liquid Crystal Composition 1)

The components shown below were mixed with each other and a liquid crystal composition 1 was prepared.

Polymerizable liquid crystal compound 1 (structure below): 1 g

Chiral agent 1 (structure below): 107 mg

Horizontal alignment agent 1 (structure below): 1 mg

Photo-radical initiator 1 (structure below): 40 mg

Polymerization inhibitor 1 (structure below): 10 mg

Methyl ethyl ketone (MEK): 1.6 g

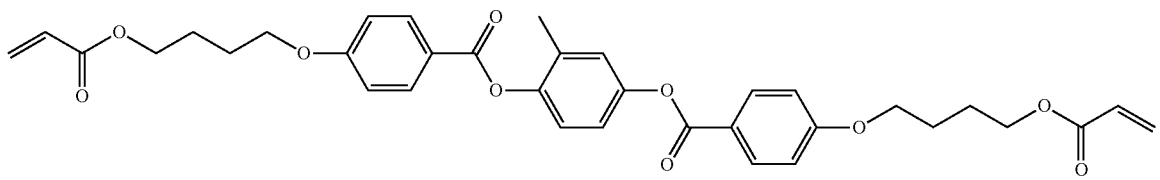

Liquid crystal compound 1

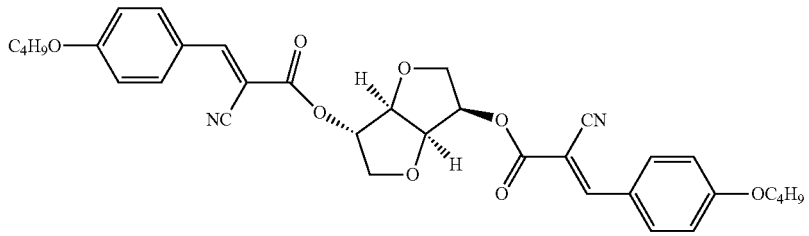

Chiral agent 1

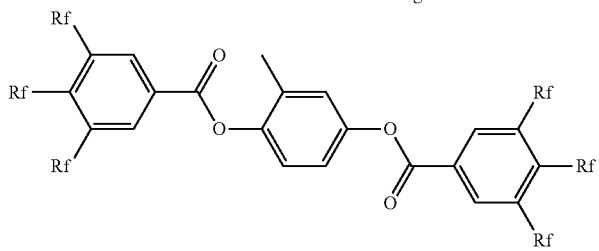

Horizontal alignment agent 1

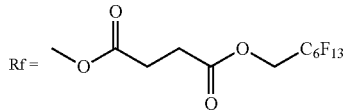

Photo-radical initiator 1 (IRGACURE 819 manufactured by BASF (structure below))

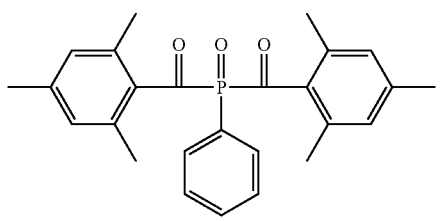

Polymerization inhibitor 1 (IRGANOX 1010 manufactured by BASF (structure below))

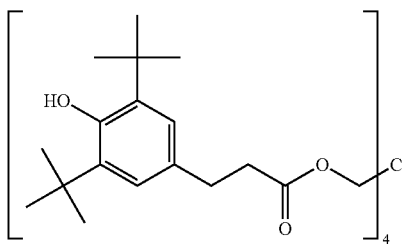

Example 1

The liquid crystal composition 1 was applied onto a PET (polyethylene terephthalate, COSMOSHINE A4100) film manufactured by Toyobo Co., Ltd. having a thickness of 100 μm, by using a wire bar at room temperature, and dried to form a coating (a thickness of the coating after drying (dried film) was adjusted to approximately 2 to 5 μm).

The UV irradiation was performed with respect to the obtained coating for a certain time through a black mask having opening, under oxygen atmosphere at room temperature (first light irradiation). After the first light irradiation, the UV irradiation was further performed with respect to the entire surface of the coating for a certain time in a state where the mask was removed (second light irradiation). Through the first light irradiation and the second light irradiation, the adjustment was performed so that the exposed amount of a region where the mask was not present in the first light irradiation and the second light irradiation (region where the opening was positioned) was 50 mJ/cm$^2$ and the exposed amount of a region which was shielded by the mask in the first light irradiation was 15 mJ/cm$^2$.

In the examples, as the light source of the UV irradiation, "UV TRANSILLUMINATOR LM-26 TYPE" (manufactured by Funakoshi Co., Ltd.) was used in the step of performing the exposure treatment with respect to the coating in a pattern shape (pitch adjusting step) described above, and "EXECURE 3000-W" (manufactured by HOYA CANDEO OPTRONICS) was used in the curing step which will be described later.

Next, the heat treatment was performed with respect to the coating by leaving the PET film on which the coating was formed on a hot plate at 100° C. for 1 minute, and the phase was set in a state of the cholesteric liquid crystalline phase.

Next, the UV irradiation was performed with respect to the coating after the heat treatment for a certain time under nitrogen atmosphere (oxygen concentration of 500 ppm or less) at room temperature, to cure the coating, and accordingly, the cholesteric liquid crystalline layer was formed. The cholesteric liquid crystalline layer obtained through the steps described above shows right circular polarization reflectivity and includes two reflection regions having different selective reflection wavelengths (see FIG. 1).

A double-sided optical pressure sensitive adhesive film ("MCS70", manufactured by Mecanusa Inc.) was bonded to the surface of the obtained cholesteric liquid crystalline layer side, the cholesteric liquid crystalline layer was transferred from the PET film described above to a left circular polarization plate ("CP125L", manufactured by Mecanusa Inc.), and accordingly, a transmission decorative film was manufactured (see FIG. 1).

As a result, in a case where the transmission decorative film was observed from the cholesteric liquid crystalline layer side, an image to be formed could be visually recognized from two reflection regions having different selective reflection wavelengths. Meanwhile, in a case where the transmission decorative film was observed from the left circular polarization plate side, the image was not visually recognized.

The haze of the cholesteric liquid crystalline layer which is the circular polarization reflection layer was 1.4%.

Example 2

Next, a transmission decorative film was manufactured by using a liquid crystal composition 2 having the same composition as the liquid crystal composition 1, except the chiral agent was changed from the chiral agent 1 to a chiral agent 2, and by the same method as in Example 1, except that the right circular polarization plate was used.

As a result, in a case where the transmission decorative film was observed from the cholesteric liquid crystalline layer side, an image to be formed could be visually recognized from two reflection regions having different selective reflection wavelengths. Meanwhile, in a case where the transmission decorative film was observed from the right circular polarization plate side, the image was not visually recognized.

The haze of the cholesteric liquid crystalline layer which is the circular polarization reflection layer was 13%.

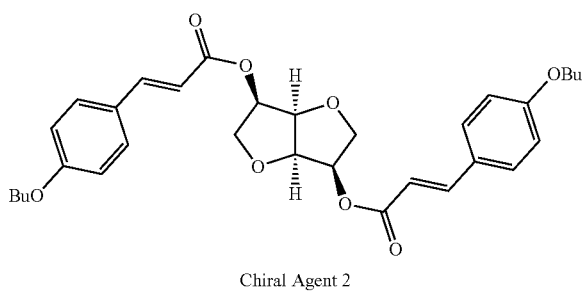

Chiral Agent 2

Example 3

The liquid crystal composition 1 was applied onto a PET (polyethylene terephthalate, COSMOSHINE A4100) film manufactured by Toyobo Co., Ltd. having a thickness of 100 μm, by using a wire bar at room temperature, and dried to form a coating (a thickness of the coating after drying (dried film) was adjusted to approximately 2 to 5 μm).

The UV (ultraviolet) irradiation was performed with respect to the obtained coating for a certain time through a black mask having opening, under oxygen atmosphere at room temperature (first light irradiation). After the first light irradiation, the UV irradiation was further performed with respect to the entire surface of the coating for a certain time in a state where the mask was removed (second light irradiation). The exposed amount in the first light irradiation was adjusted so that the selective reflection wavelength in the exposure region after the cholesteric liquid crystalline phase was fixed becomes a wavelength exceeding a visible light wavelength range. In addition, the exposed amount in the second light irradiation was adjusted so that the selective reflection wavelength of the region shielded by the mask in the first light irradiation is in the range of red light, after the cholesteric liquid crystalline phase was fixed.

Next, the heat treatment was performed with respect to the coating by leaving the PET film on which the coating was formed on a hot plate at 100° C. for 1 minute, and the phase was set in a state of the cholesteric liquid crystalline phase.

Next, the UV irradiation was performed with respect to the coating after the heat treatment for a certain time under nitrogen atmosphere (oxygen concentration of 500 ppm or less) at room temperature, to cure the coating, and accordingly, the cholesteric liquid crystalline layer (first layer) was formed.

The cholesteric liquid crystalline layer (first layer) obtained through the steps described above shows right circular polarization reflectivity and includes two reflection regions having different selective reflection wavelengths.

A cholesteric liquid crystalline layer (second layer) was formed on the PET film attached with the obtained cholesteric liquid crystalline layer (first layer) by the same manufacturing method as in the case of the cholesteric liquid crystalline layer (first layer). In the manufacturing of the cholesteric liquid crystalline layer (second layer), a mask which is the same as the mask used in the manufacturing of the cholesteric liquid crystalline layer (first layer) was used. In the manufacturing of the cholesteric liquid crystalline layer (second layer), the exposed amount in the second light irradiation was adjusted so that the selective reflection wavelength of the region shielded by the mask in the first light irradiation is in the range of green light, after the cholesteric liquid crystalline phase was fixed.

Then, a cholesteric liquid crystalline layer (third layer) was formed on the cholesteric liquid crystalline layer (second layer) by the same method as in the case of the cholesteric liquid crystalline layer (second layer). In the manufacturing of the cholesteric liquid crystalline layer (third layer), a mask which is the same as the mask used in the manufacturing of the cholesteric liquid crystalline layer (first layer) was used. In the manufacturing of the cholesteric liquid crystalline layer (third layer), the exposed amount in the second light irradiation was adjusted so that the selective reflection wavelength of the region shielded by the mask in the first light irradiation is in the range of blue light, after the cholesteric liquid crystalline phase was fixed.

As a result, the circular polarization reflection layer including the three layers of the cholesteric liquid crystalline layers was formed (see FIG. 5).

A double-sided optical pressure sensitive adhesive film (MCS70, manufactured by Mecanusa Inc.) was bonded to the surface of the PET film attached with the obtained circular polarization reflection layer on the circular polarization reflection layer side. Next, the circular polarization reflection layer was transferred from the PET film to a left circular polarization plate ("CP125L", manufactured by Mecanusa Inc.), and accordingly, a transmission decorative film was manufactured.

The transmission decorative film included the cholesteric liquid crystalline layer including a reflection region reflecting blue light, the cholesteric liquid crystalline layer including a reflection region reflecting green light, and the cholesteric liquid crystalline layer including a reflection region reflecting red light, and as shown in FIG. 5, in a case where the transmission decorative film was observed from the front surface side, the reflection region reflecting blue light, the reflection region reflecting green light, and the reflection region reflecting red light were disposed in an overlapped manner.

As a result, in a case where the transmission decorative film was observed from the surface on the circular polarization reflection layer side (front surface), one reflection region was colored white, and the other reflection region was transparent. In addition, in a case where the transmission decorative film was observed from the surface on the left circular polarization plate side (rear surface), an image displayed on the front surface was not visually recognized.

The haze of the circular polarization reflection layer was 2.6%.

Example 4

In the method of manufacturing the transmission decorative film of Example 3, a transmission decorative film was manufactured by the same method as in Example 3, except that the exposed amount in the first light irradiation and the exposed amount in the second light irradiation were changed in the manufacturing of a first reflection layer (second layer).

The transmission decorative film is configured to include a circular polarization reflection layer configured of two cholesteric liquid crystalline layers showing right circular polarization reflectivity and a cholesteric liquid crystalline layer showing left circular polarization reflectivity, and a left circular polarization plate (see FIG. 7).

As a result, in a case where the transmission decorative film was observed from the circular polarization reflection layer side, one region was colored white, and the other region was transparent. In a case where the transmission decorative film was observed from the left circular polarization plate side, a pattern according to the reflection region of the cholesteric liquid crystalline layer showing the left circular polarization reflectivity was visually recognized.

The haze of the circular polarization reflection layer was 7.8%.

Example 5

A transmission decorative film was manufactured in the same manner as in Example 1, except that a base material film obtained by performing a rubbing treatment to a PET (polyethylene terephthalate, COSMOSHINE A4100) film manufactured by Toyobo Co., Ltd. having a thickness of 100 µm, was used as the base material used in the formation of the cholesteric liquid crystalline layer, and both the base material and the cholesteric liquid crystalline layer were bonded onto the circular polarization plate, without peeling the base material film from the cholesteric liquid crystalline layer, after forming the cholesteric liquid crystalline layer. In this case, the base material film functions as a surface protective layer.

Example 6

The following acrylic solution was bar-coated on a PET (polyethylene terephthalate, COSMOSHINE A4100) film manufactured by Toyobo Co., Ltd. having a thickness of 100 as a base material used in the formation of the cholesteric liquid crystalline layer, so as to have a film thickness of approximately 5 µm, the UV irradiation at 300 mJ/cm² at 60° C. and curing were performed, and an alignment adjusting layer was formed. A transmission decorative film was manufactured in the same manner as in Example 1, except that a laminated film including the PET film and the alignment adjusting layer was used, the cholesteric liquid crystalline layer was formed on the alignment adjusting layer of this laminated film, and then, both the laminated film and the cholesteric liquid crystalline layer were bonded onto the circular polarization plate, without peeling the laminated film from the cholesteric liquid crystalline layer (see FIG. 13).

Composition of Acrylic Solution
VANARESIN GH-1203 (manufactured by Shin-Nakamura Chemical Co., Ltd.): 48 wt %
VISCOAT #360 (manufactured by Osaka Organic Chemical Industry Ltd.): 48 wt %
IRGACURE 819 (manufactured by BASF): 3.99 wt %
Horizontal alignment agent 1: 0.01 wt %
The solid content was adjusted so as to be 30 wt % with MEK/MIBK (methyl isobutyl ketone) (1 wt %/1 wt %).

Example 7

(Manufacturing of Cholesteric Liquid Crystalline Layer)
<<Preparation of Liquid Crystal Composition 3>>
The components shown below were mixed with each other and a liquid crystal composition 3 was prepared.
Liquid crystal compound 1 (structure below): 1 g
Chiral agent 3 (structure below): 66 mg
Horizontal alignment agent 1 (structure below): 0.4 mg
Horizontal alignment agent 2 (structure below): 0.15 mg
Photo-radical initiator 2 (structure below): 20 mg
A-TMMT (manufactured by Shin-Nakamura Chemical Co., Ltd.): 10 mg
Methyl ethyl ketone (MEK): 1.09 g
Cyclohexanone: 0.16 g

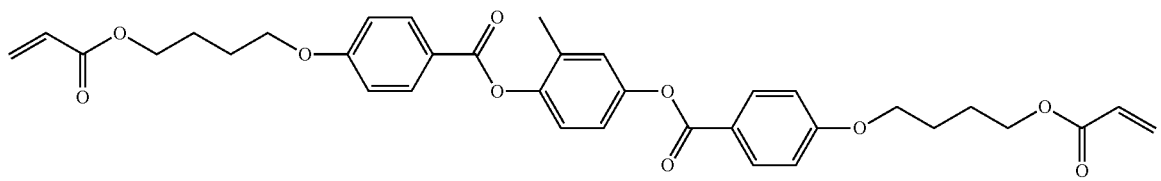

Liquid crystal compound 1

-continued

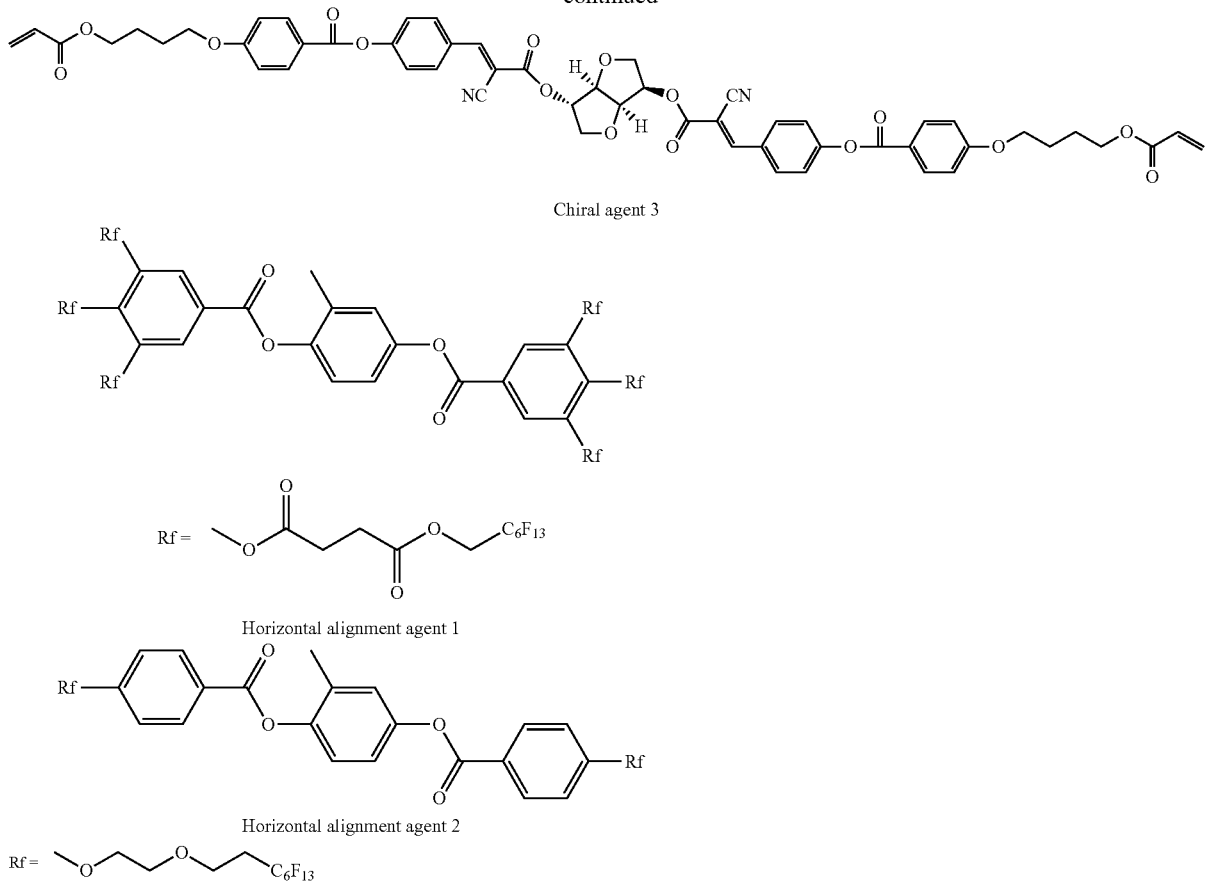

Chiral agent 3

Horizontal alignment agent 1

Horizontal alignment agent 2

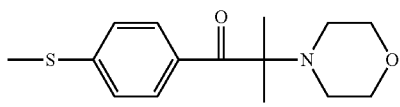 [SMILES: CSc1ccc(C(=O)C(C)(C)N2CCOCC2)cc1]

Photo-radical initiator 2 (IRGACURE 907 manufactured by BASF (structure below))

<<Manufacturing of Base Material>>

The base material in which the alignment adjusting layer was formed on the PET film was used as the base material used in the formation of the cholesteric liquid crystalline layer.

Specifically, the following acrylic solution was bar-coated on a PET film (polyethylene terephthalate film, COSMOS-HINE A4100) manufactured by Toyobo Co., Ltd. having a thickness of 100 μm, so as to have a film thickness of approximately 2 to 5 μm, and the coating was formed. Next, the UV irradiation at 500 mJ/cm² at 60° C. was performed with respect to the PET film on which the coating was formed, under nitrogen atmosphere, to cure the coating, and the alignment adjusting layer was formed.

<<Composition of Acrylic Solution>>

KAYARAD PET-30 (manufactured by Nippon Kayaku Co., Ltd.): 100 parts by mass
IRGACURE 819 (manufactured by BASF): 3.99 parts by mass
Horizontal alignment agent 1: 0.01 parts by mass The concentration of solid content was adjusted so as to be 40% by mass with methyl ethyl ketone (MEK).

Next, the liquid crystal composition 3 was applied onto the alignment adjusting layer by using a wire bar at room temperature, and dried to form a coating (a thickness of the coating after drying (dried film) was adjusted to approximately 2 to 5 μm).

The UV irradiation was performed with respect to the obtained coating through a black mask having opening, for approximately 50 seconds under oxygen atmosphere at room temperature. In this case, the concentration of the black color of the mask and the UV irradiation time were adjusted so that the exposed amount of a region where the mask is not present (region where the opening was positioned) was 25 mJ/cm² and the exposed amount of a region which was shielded by the mask was 5 mJ/cm².

In the examples, as the light source of the UV irradiation, "UV TRANSILLUMINATOR LM-26 TYPE" (exposure wavelength: 365 nm, manufactured by Funakoshi Co., Ltd.) was used in the step of performing the exposure treatment with respect to the coating in a pattern shape (pitch adjusting step) described above, and "EXECURE 3000-W" (manufactured by HOYA CANDEO OPTRONICS) was used in the curing step which will be described later.

Next, the heat treatment was performed with respect to the coating by leaving the PET film on which the coating was formed on a hot plate at 90° C. for 1 minute, and the phase was set in a state of the cholesteric liquid crystalline phase.

Next, the UV irradiation was performed with respect to the coating after the heat treatment under nitrogen atmosphere (oxygen concentration of 500 ppm or less) at 80° C. so that the exposed amount was 500 mJ/cm² to cure the coating, and accordingly, the cholesteric liquid crystalline layer was formed. The cholesteric liquid crystalline layer obtained through the steps described above shows right circular polarization reflectivity and includes two reflection regions having different selective reflection wavelengths. The haze of the cholesteric liquid crystalline layer which is the circular polarization reflection layer was 2.3%.

EXPLANATION OF REFERENCES 10a, 10b, 10c, 10d, 10e, 10f: transmission decorative film
12: circular polarization plate
13a: coating
13b: partially exposed coating
13c: entirely exposed coating
13d: coating in state of cholesteric liquid crystalline phase
12a: exposed surface
14, 18a, 20a, 22a, 18b, 20b, 22b, 114, 214, 314: first cholesteric liquid crystalline layer
14rR, 22rR, 114rR, 214rR, 314rR: red right circular polarization reflection region
14rG, 20rG, 114rG, 214rG, 314rG: green right circular polarization reflection region
14rB, 18rB: blue right circular polarization reflection region
18rI, 20rI, 22rI, 214rI: infrared right circular polarization reflection region
26lR: red left circular polarization reflection region
26lG: green left circular polarization reflection region
26lI: infrared left circular polarization reflection region
16a, 16b, 24: circular polarization reflection layer
26: second cholesteric liquid crystalline layer
30: alignment adjusting layer
31: surface protective layer
32: laminated film
S: light source
H: heater
UV: ultraviolet irradiation device
M: mask

What is claimed is:

1. A transmission decorative film comprising:
a circular polarization plate; and
a circular polarization reflection layer disposed on the circular polarization plate,
wherein the circular polarization reflection layer includes at least one or more first cholesteric liquid crystalline layers that reflect any one of left circularly polarized light or right circularly polarized light,
the first cholesteric liquid crystalline layer includes two or more reflection regions having different selective reflection wavelengths, and
the circular polarization plate transmits circularly polarized light having a revolution direction opposite to a revolution direction of the circularly polarized light reflected by the first cholesteric liquid crystalline layer.

2. The transmission decorative film according to claim 1, wherein the selective reflection wavelengths in the two or more reflection regions are different from each other by 30 nm or more.

3. The transmission decorative film according to claim 1, wherein a haze of the circular polarization reflection layer is 30% or less.

4. The transmission decorative film according to claim 1, wherein the circular polarization reflection layer includes a plurality of the first cholesteric liquid crystalline layers.

5. The transmission decorative film according to claim 1, wherein the circular polarization reflection layer further includes a second cholesteric liquid crystalline layer that reflects circularly polarized light having a revolution direction opposite to that of the circularly polarized light reflected by the first cholesteric liquid crystalline layer, and includes two or more reflection regions having selective reflection wavelengths different from each other.

6. A method of manufacturing the transmission decorative film according to claim 1, the method comprising:
a step of forming a coating using a liquid crystal composition including a liquid crystal compound including a polymerizable group, and a chiral agent sensitive to light and capable of changing a helical pitch of a cholesteric liquid crystalline phase;
a step of performing an exposure treatment on the coating in a pattern shape, with light to which the chiral agent is sensitive;
a step of performing a heating treatment on the coating subjected to the exposure treatment and aligning the liquid crystal compound to be in a state of a cholesteric liquid crystalline phase; and
a step of performing a curing treatment on the coating subjected to the heating treatment and forming the first cholesteric liquid crystalline layer formed by fixing the cholesteric liquid crystalline phase.

7. The transmission decorative film according to claim 2, wherein a haze of the circular polarization reflection layer is 30% or less.

8. The transmission decorative film according to claim 2, wherein the circular polarization reflection layer includes a plurality of the first cholesteric liquid crystalline layers.

9. The transmission decorative film according to claim 3, wherein the circular polarization reflection layer includes a plurality of the first cholesteric liquid crystalline layers.

10. The transmission decorative film according to claim 2, wherein the circular polarization reflection layer further includes a second cholesteric liquid crystalline layer that reflects circularly polarized light having a revolution direction opposite to that of the circularly polarized light reflected by the first cholesteric liquid crystalline layer, and includes two or more reflection regions having selective reflection wavelengths different from each other.

11. The transmission decorative film according to claim 3, wherein the circular polarization reflection layer further includes a second cholesteric liquid crystalline layer that reflects circularly polarized light having a revolution direction opposite to that of the circularly polarized light reflected by the first cholesteric liquid crystalline layer, and includes two or more reflection regions having selective reflection wavelengths different from each other.

12. The transmission decorative film according to claim 4, wherein the circular polarization reflection layer further includes a second cholesteric liquid crystalline layer that reflects circularly polarized light having a revolution direction opposite to that of the circularly polarized light reflected by the first cholesteric liquid crystalline layer, and includes two or more reflection regions having selective reflection wavelengths different from each other.

* * * * *